United States Patent [19]

Harada

[11] Patent Number: 5,457,329
[45] Date of Patent: Oct. 10, 1995

[54] VOLTAGE-DRIVEN THYRISTOR

[75] Inventor: Masana Harada, Hyogo, Japan

[73] Assignee: Mitsubishi Denki Kabushiki Kaisha, Tokyo, Japan

[21] Appl. No.: 294,708

[22] Filed: Aug. 23, 1994

[30] Foreign Application Priority Data

Dec. 15, 1993 [JP] Japan .................................. 5-315045

[51] Int. Cl.$^6$ .......................... H01L 29/74; H01L 29/743
[52] U.S. Cl. .......................... 257/153; 257/151; 257/138; 257/147
[58] Field of Search ..................... 257/138, 139, 257/140, 143, 144, 146, 147, 149, 151, 152, 153, 132, 133, 135, 136, 137, 170, 157, 158, 159, 124, 125

[56] References Cited

U.S. PATENT DOCUMENTS 4,760,431  7/1988  Nakagawa et al. ................... 257/138

FOREIGN PATENT DOCUMENTS 58-202575  11/1983  Japan .
60-253275  12/1985  Japan .
4-317375   11/1992  Japan .

OTHER PUBLICATIONS

"Constant-Current Contour I'Lot For The Description Of Short–Channel Effects Of MOS Transistors", Choong–Ki Kim et al., IEEE Transactions on Electron Devices, D–33, No. 10, Oct. 1986.
"MOS–Controlled Thyristors—A New Class Of Power Devices", Victor Temple, IEEE Transactions on Electron Devices, vol. ED–33, No. 10, Oct. 1986.

Primary Examiner—Robert P. Limanek
Assistant Examiner—Wael M. Fahmy
Attorney, Agent, or Firm—Lowe, Price, LeBlanc & Becker

[57]  ABSTRACT

An n-buffer layer and an n$^-$-base layer are formed on a p$^+$-anode layer. A p-base layer is formed on the n$^-$-base layer. The p-base layer has a p-type impurity layer protruding into n$^-$-base layer. An n-cathode layer, an n$^+$-cathode layer and a P+-impurity layer are formed on p-base layer. First trenches are formed through p$^+$-impurity later, n-cathode layer and p-base layer. On-gates are formed in the first trenches. Second trenches are formed through p$^+$-impurity layer and n-cathode layer with their bottom surfaces located in p-type impurity layer. Off-gates are formed in the second trenches. First and second trenches are preferably formed alternately. Thereby, a voltage-driven thyristor has improved turn-on and turn-off characteristics and a high reliability.

17 Claims, 24 Drawing Sheets

VOLTAGE-DRIVEN THYRISTOR

BACKGROUND OF THE INVENTION

1. Field of the Invention

The present invention relates to a voltage-driven thyristor, and in particular to a voltage-driven thyristor having superior turn-on and turn-off characteristics as well as high reliability.

2. Description of the Related Art

As is known, voltage-driven thyristors are a kind of switch elements. An example of the voltage driven thyristor is disclosed in *IEEE TRANSACTIONS ON ELECTRON DEVICES*, Vol. ED33, No. 10, October 1986.

FIG. 24 shows a section of the voltage-driven thyristor disclosed in the above reference. Referring to FIG. 24, an n-buffer layer 102 is formed on a $p^+$-anode layer 101. An anode electrode 112 is formed on the bottom surface of the $p^+$-anode layer 101. An $n^-$-base layer 103 is formed on the n-buffer layer 102.

P-base layers 104 are formed selectively on the surface of $n^-$-base layer 103. An $n^+$-cathode layer 106 and n-cathode layers 105 are formed on each p-base layer 104. n-cathode layers 105 are located at opposite sides of the $n^+$-cathode layer 106. On n-cathode layers 105 are formed $p^+$-impurity layers 107 which are also located at opposite sides of $n^+$-cathode layer 106.

Surface layers of the p-base layer 104 form first channel forming regions 113 of a n-channel MOS transistor, which will be described later. A surface layer of the n-cathode layer 105 adjacent to the first channel forming region 113 forms a second channel forming region 114 of an p-channel MOS transistor, which will be described later.

A gate electrode 109 is formed on the first and second channel forming regions 113 and 114 with a gate oxide film 108 therebetween. Thus, the gate electrode 109, p-base layer 104 and $p^+$-impurity layer 107 form a p-channel MOS transistor, of which channel forming region is the second channel forming region 114. The gate electrode 109, $n^-$-base layer 103 and n-cathode layer 105 form the n-channel MOS transistor, of which channel forming region is the first channel forming region 113.

The gate electrode 109 is covered with a cap oxide film 110. Cap oxide film 110 is covered with a cathode electrode 111 which are in contact with $n^+$-cathode layer 106 and $p^+$-impurity layers 107.

Then, an operation of the conventional voltage-driven thyristor having the above structure will be described below with reference to FIG. 25, which shows an operation principle of the voltage-driven thyristor shown in FIG. 24. Referring to FIG. 25, a pnp transistor Tr1 is formed of $p^+$-anode layer 101, n-base layer 103, n-buffer layer 102 and p-base layer 104. An npn transistor Tr2 is formed of $n^-$-base layer 103, p-base layer 104 and $n^+$-cathode layer 106.

A thyristor is formed of the $p^+$-anode layer 101, n-buffer layer 102, $n^-$-base layer 103, p-base layer 104 and $n^+$-cathode layer 106. A p-channel MOS transistor M2 is formed of gate electrode 109, $p^+$-impurity layer 107 and p-base layer 104. An n-channel MOS transistor M1 is formed of n-cathode layer 105, gate electrode 109 and $n^-$-base layer 103.

When the voltage-driven thyristor having the above structure is in the on-state, a main current flows from anode electrode 112 to cathode electrode 111. When it is in the off-state, the main current does not flow from anode electrode 112 to cathode electrode 111. The on-state and off-state of the voltage-driven thyristor will be described below.

First, the on-state will be described below. The on-state is attained when a positive voltage is applied to anode electrode 112 against cathode electrode 111 and a positive voltage is applied to the gate electrode 109. By applying the positive voltage, which is not lower than a threshold voltage of the transistor M1, to gate electrode 109, n-channel MOS transistor M1 is turned on. Thereby, electrons flow into $n^-$-base layer 103 through the channel of transistor M1, and thus pnp transistor Tr1 is turned on. Thereby, holes flow into p-base layer 104 from the $p^+$-anode layer 101, so that npn transistor Tr2 is also turned on. Consequently, the thyristor formed of transistors Tr1 and Tr2 is turned on. Thus, the main current flows between anode electrode 112 and cathode electrode 111.

Then, the off-state will be described below. The off-state of the thyristor is attained by applying a negative voltage to gate electrode 109. MOS transistor M1 is turned off and p-channel MOS transistor M2 is turned on by applying a negative voltage (not higher than the threshold voltage of p-channel MOS transistor M2) to gate electrode 109. Thereby, holes are drawn from p-base layer 104. Consequently, a depletion layer spreads at the junction portion between p-base layer 104 and $n^-$-base layer 103, so that holes do not flow from the $p^+$-anode layer 101 into p-base layer 104, whereby the off-state of the thyristor is attained.

However, the conventional voltage-driven thyristor shown in FIGS. 24 and 25 suffer from the following problem, which will be described below using FIG. 26. FIG. 26 is a schematic diagram showing the problem of the conventional voltage-driven thyristor.

Referring to FIG. 26, an inverted layer is formed at the second channel forming region 114 when the thyristor is in the off-state. This inverted layer is formed only at the position directly under gate electrode 109. Therefore, all the holes to be drawn from p-base layer 104 must move up to the second channel forming region 114.

Thus, even the holes existing at the portion remote from the second channel forming region 114 flows through the second channel forming region 114 into $p^+$-impurity layer 107. Therefore, the holes, which existed at the position remote from the second channel forming region 114, move a long distance before reaching the channel forming region 114. This increases a resistance against the holes being drawn, resulting in such a problem that a long time is required for setting the thyristor to the off-state. Also, the increased resistance against the holes being drawn disadvantageously reduces a magnitude of the main current which can be interrupted.

As an improvement for overcoming the problem that a long time is required for setting the thyristor to the off-state, there is a voltage-driven thyristor disclosed in Japanese Patent Laying-Open No. 60-253275. FIG. 27 is a cross section showing the voltage-driven thyristor disclosed in Japanese Patent Laying-Open No. 60-253275.

Referring to FIG. 27, the voltage-driven thyristor is provided with deep first V-grooves 115a (only one is shown in the figure) for turning on the thyristor and shallow second V-grooves 115b for turning off the thyristor. A first gate electrode 109a is formed on the inner surface of each first V-groove 115a with the gate oxide film 108 therebetween. A second gate electrode 109b is formed on the inner surface of each second V-groove 115b with the gate oxide film 108 therebetween.

The voltage-driven thyristor disclosed in Japanese Patent

Laying-Open No. 60-253275 has such features that there are provided two kinds of grooves, i.e., deep first V-grooves 115a and shallow second V-grooves 115b, and that the deep first V-grooves 115a are small in number than the shallow second V-grooves 115b.

An operation of the improved voltage-driven thyristor will be described below with reference to FIGS. 27 and 28. FIG. 28 is a schematic diagram for showing an advantage of the improved voltage-driven thyristor. Referring to FIG. 27, the thyristor is turned on by applying a positive potential to the first gate electrode 109a. Thereby, electrons flow through the first channel forming regions 113 into n⁻-base layer 103. Thereby, the thyristor is turned on in a manner similar to the voltage-driven thyristor already described with reference to FIGS. 24 and 25.

The thyristor is turned off by applying a negative voltage to the first and second gate electrodes 109a and 109b. When the negative voltage is applied to the first and second gate electrodes 109a and 109b, inverted layers are formed at the second channel forming regions 114. Thereby, the thyristor is turned off in a manner similar to the conventional voltage-driven thyristor already described with reference to FIGS. 24 and 25.

In the improvement shown in FIG. 27, the second channel forming regions 114 are formed in a longitudinal direction and located near p-base layer 104. This reduces a resistance against holes being drawn from p-base layer 104. This results in an advantage that a time for setting the thyristor to the off-state is short. Also, a magnitude of the interruptible main current can be increased owing to the small resistance against holes being drawn from p-base layer 104.

However, the above improvement suffers from the following two problems, which will be described below with reference to FIGS. 29 and 30. A first problem will now be described below with reference to FIG. 29, which is a schematic cross section for showing the first problem of the above improvement.

In the operation for setting the improved thyristor shown in FIG. 29 to the on-state, an inverted layer is formed in the first channel forming region 113 at each side wall of the first V-groove 115a, and electrons flow from n-cathode layer 105 into n⁻-base layer 103. These electrons flow into p⁺-anode layer 101. Holes are fed into the n⁻-base layer 103 through the same path as the electrons flowing into p⁺-anode layer 101. This improvement is designed to include a relatively small number of first V-grooves 115a. Therefore, fewer holes are supplied from p⁺-anode layer 101 into the portion of n⁻- base layer 103 remote from the first V-groove 115a. This results in a problem that a long time is required for setting the thyristor to the on-state.

Then, the second problem of the improvement will be described below with reference to FIG. 30, which is an enlarged cross section of the first V-groove 115a for showing the second problem.

Referring to FIG. 30, the first V-groove 115a has a bottom reaching n⁻-base layer 103. Thus, a bottom end region 116 of the first V-groove 115a is located in n⁻-base layer 103. Therefore, an electric field is likely to concentrate at the vicinity of end region 116a. This likely results in breakage of the pn junction near end region 116 and thus flow of a leak current near end region 116. As a result, the thyristor may shift to the off-state due to the leak current even if the thyristor is to be held in the off-state. Thus, the reliability may decrease.

SUMMARY OF THE INVENTION

Accordingly, it is an object of the invention to overcome the above problems, and particularly to provide a voltage-driven thyristor and a method of manufacturing the same, which can improve both the turn-on and turn-off characteristics of the thyristor.

Another object of the invention is to provide a voltage-driven thyristor having high breakdown voltage as well as a method of manufacturing the same.

According to a first aspect of the invention, a voltage-driven thyristor includes a first semiconductor layer of a first conductivity type, a second semiconductor layer of a second conductivity type, a third semiconductor layer of the first conductivity type, a fourth semiconductor layer of the second conductivity type, a fifth semiconductor layer of the first conductivity type, a plurality of first and second trenches, a plurality of first and second gate electrodes, a cathode electrode and an anode electrode. The second semiconductor layer is formed on the first semiconductor layer. The third semiconductor layer is formed on the second semiconductor layer. The fourth semiconductor layer is formed on the third semiconductor layer. The fifth semiconductor layer is selectively formed on a surface of the fourth semiconductor layer. The first trenches are formed through the fourth and third semiconductor layers and reach the second semiconductor layer. The second trenches are formed through the fifth and fourth semiconductor layers and have bottom surfaces located in the third semiconductor layer. The first and second trenches are disposed alternately. The first and second gate electrodes are formed in the first and second trenches, respectively. The cathode electrode is formed on the fourth and fifth semiconductor layers. The anode electrode is formed on a lower surface of the first semiconductor layer.

According to the voltage-driven thyristor of the first aspect, the first and second trenches are disposed alternately. Therefore, the first trenches can be substantially equal in number to the second trenches. The improvement in the prior art described before has the problem relating to setting of the voltage-driven thyristor to the on-state due to the fact that V-grooves 115a for turning on the voltage-driven thyristor are small in number. Meanwhile, according to the invention, a rate of the first trenches, which contribute to the setting of the voltage-driven thyristor to the on-state, is increased, so that carries can be efficiently supplied into the second semiconductor layer. Therefore, a time required for setting the voltage-driven thyristor to the on-sate can be reduced. Also, the first gate electrodes can be disposed regularly at a high density. Accordingly, carriers can be supplied efficiently and uniformly into the second semiconductor layer from the first semiconductor layer. This also contributes to reduction of the time required for setting the voltage-driven thyristor to the on-state.

According to the voltage-driven thyristor of a second aspect, a junction portion between the third and second semiconductor layers is constant in depth from an upper surface of the fifth semiconductor layer.

The voltage-driven thyristor of the second aspect is not provided with a second region, which is provided in a voltage-driven thyristor of an twelfth aspect. Therefore, the first and second trenches can be arranged at a higher density. This enables more quick setting of the voltage-driven thyristor to the on-state.

According to the voltage-driven thyristor of a third aspect, the third semiconductor layer has a first region and a second region. The first region has a first junction portion joining to the second semiconductor layer and located at a first depth from the upper surface of the fifth semiconductor layer. The second region has a second junction portion joining to the second semiconductor layer and located at a second depth from the upper surface of the fifth semiconductor layer, which is larger than the first depth. The first trenches are located through the first region, and the second trenches have bottom surfaces located in the second region.

According to the voltage-driven thyristor of a fourth aspect, the fifth semiconductor layer is selectively formed along a longitudinal direction of the first and second trenches. The fourth semiconductor layer exists between the fifth semiconductor layers. A concentration of impurities of the second conductivity type contained in the fourth semiconductor layer existing between the fifth semiconductor layers is higher than a that of the fourth semiconductor layer underlying the fifth semiconductor layer.

According to the voltage-driven thyristor of a fifth aspect, the fifth semiconductor layer extends parallel to the second trench and along a side wall of the second trench. A surface layer of the fourth semiconductor layer extends parallel to the first trench and along a side wall of the first trench.

According to the voltage-driven thyristor of the fifth aspect, a density of a region in the fourth semiconductor layer adjoining to the side wall of the first trench is high. Thus, the density of impurities is high at the region through which a main current flows during the on-state of the voltage-driven thyristor. Thereby, it is possible to reduce a resistance of a path of the main current, and thus a large current can be easily obtained during the on-state.

According to the voltage-driven thyristor of a sixth aspect, the fifth semiconductor layer extends parallel to the second trench and along a side wall of the second trench. The fifth semiconductor layer has a local portion reaching a side wall of the first trench.

According to the voltage-driven thyristor of the sixth aspect, the fifth semiconductor layer has the local portion reaching the side wall of the first trench. Thus, it is possible to increase a channel width of a transistor which operates as a major component when the voltage-driven thyristor is turned off. Thereby, the voltage-driven thyristor can smoothly shift to the off-state.

According to the voltage-driven thyristor of a seventh aspect, a surface layer of the fourth semiconductor layer extends parallel to the first trench and along a side wall of the first trench. The fourth semiconductor layer is provided at its surface layer with a local portion reaching a side wall of the second trench.

According to the voltage-driven thyristor of the seventh aspect, the fourth semiconductor layer has the local portion reaching the side wall of the second trench. Thereby, in contrast to the sixth aspect, the voltage-driven thyristor can smoothly shift to the on-state. Also, a contact area between the fourth semiconductor layer and the cathode electrode can be increased. Therefore, it is possible to increase a current flowing through the voltage-driver thyristor.

According to the voltage-driven thyristor of an eighth aspect, a concentration of impurities of the first conductivity type contained in a first region of the third semiconductor layer adjoining to a side wall of the first trench is lower than that of a second region of the third semiconductor layer adjoining to a side wall of the second trench.

According to the voltage-driven thyristor of the eighth aspect, the density of the second region of the third semiconductor layer adjoining to the side wall of the second trench is higher than that of the first region of the third semiconductor layer adjoining to the side wall of the first trench. A channel of an MOS transistor, which operates as a major component for setting the voltage-driven thyristor to the off-state, is formed on this second region. Therefore, carriers can be efficiently supplied to the above channel when the voltage-driven thyristor shifts to the off-state. Therefore, the voltage-driven thyristor can quickly shift to the off-state.

According to the voltage-driven thyristor of a ninth aspect, the third semiconductor layer has a third region of the first conductivity type which has a portion located under the second trench and protrudes into the second semiconductor layer.

According to the voltage-driven thyristor of a tenth aspect, a concentration of impurities of the first conductivity type contained in the second region is higher than that of impurities of the first conductivity type contained in the third region.

According to the voltage-driven thyristor of an eleventh aspect, a junction portion between the third region and the second semiconductor layer is located at a position deeper than that of a bottom surface of the first trench.

According to a twelfth aspect of the invention, a voltage-driven thyristor includes a first semiconductor layer of a first conductivity type, a second semiconductor layer of a second conductivity type, a third semiconductor layer of the first conductivity type, a fourth semiconductor layer of the second conductivity type, a fifth semiconductor layer of the first conductivity type, first and second trenches, first and second gate electrodes, a cathode electrode and an anode electrode. The second semiconductor layer is formed on the first semiconductor layer. The third semiconductor layer is formed on the second semiconductor layer. The fourth semiconductor layer is formed on the third semiconductor layer. The fifth semiconductor layer is selectively formed in a surface of the fourth semiconductor layer. The third semiconductor layer includes a first region, which has a first junction portion joining to the second semiconductor layer and located at a first depth from an upper surface of the fifth semiconductor layer, and a second region, which has a second junction portion joining to the second semiconductor layer and located at a second depth larger than the first depth from the upper surface of the fifth semiconductor layer. The first trench is formed through the fourth semiconductor layer and the first region, and reaches the second semiconductor layer. The second trench is formed through the fourth and fifth semiconductor layers and has a bottom surface located in the second region. The first and second gate electrodes are formed in the first and second trenches, respectively. The cathode electrode is formed on the fourth and fifth semiconductor layers. The anode electrode is formed on a lower surface of the first semiconductor layer.

According to the voltage-driven thyristor of the twelfth aspect, the second junction portion is formed at a deep position. Therefore, a depletion layer can spread to cover a bottom of the first trench protruding into the second semiconductor layer when the voltage-driven thyristor is in the off-state. Therefore, a bottom edge of the first trench is located in the depletion layer. Meanwhile, in the depletion layer a uniform electric field is applied. Owing to the fact that the bottom edge of the first trench is located in the depletion layer, it is possible to prevent effectively the concentration of the electric field at the edge of the first trench. Thus, the reliability of the voltage-driven thyristor can be improved.

According to the voltage-driven thyristor of a thirteenth aspect, the second junction portion is located at a position deeper than the first trench. Therefore, the depletion layer can cover more surely the bottom edge of the first trench when the voltage-driven thyristor is turned on.

According to the voltage-driven thyristor of a fourteenth aspect, a concentration of impurities of the first conductivity type contained in the second region is higher than that of impurities of the first conductivity type contained in the first region.

According to the voltage-driven thyristor of the fourteenth aspect, the concentration of impurities of the first conductivity type contained in the second region is higher than that of impurities of the first conductivity type contained in the first region. The second region is located under the second trench. When the voltage-driven thyristor is turned off, an inverted layer is formed in the fourth semiconductor layer adjoining to a side wall of the second trench. Thus, a region in which the inverted layer is formed is located above the second region. When the inverted layer is formed in the fourth semiconductor layer located near the side wall of the second trench, carriers can be efficiently supplied to the inverted layer, because the concentration of impurities of the first conductivity type contained in the second region is high. Therefore, the voltage-driven thyristor can have improved turn-off characteristics such as a time required for turn-on.

According to the voltage-driven thyristor of a fifteenth aspect, a pair of the second regions are formed at opposite sides of the first region. The first trench is formed through the first region, and a pair of the second trenches have bottom surfaces located in a pair of the second regions.

According to the voltage-driven thyristor of the fifteenth aspect, since the second regions are formed at opposite sides of the first region, a depletion layer can easily cover a bottom edge of the first trench. Therefore, the voltage-driven thyristor can have improved reliability.

According to the voltage-driven thyristor of a sixteenth aspect, a plurality of first trenches are formed between a pair of second regions.

According to the voltage-driven thyristor of the sixteenth aspect, a plurality of the first trenches are formed between the second regions, in which case bottom edges of first trenches can be covered with a depletion layer by appropriately adjusting a depth at which the second regions are formed. Therefore, similarly to the above case, the voltage-driven thyristor can have improved reliability.

According to a seventeenth aspect of the invention, a voltage-driven thyristor includes an anode layer of a first conductivity type, a first base layer of a second conductivity type, a second base layer of the first conductivity type, a cathode layer of the second conductivity type, an impurity layer of the first conductivity type, a plurality of first and second trenches, a plurality of on-gates, a plurality of off-gates, a cathode electrode and an anode electrode. The first base layer is formed on the anode layer. The second base layer is formed on the first base layer. The cathode layer is formed on the second base layer. The impurity layer is selectively formed in a surface of the cathode layer. The first trenches are formed through the cathode layer and the second base layer and reaches the first base layer. The second trenches are disposed alternately to the first trenches, and are formed through the impurity layer and the cathode layer with their bottom surfaces located in the second base layer. The on-gates are formed in the first trenches. The off-gates are formed in the second trenches. The cathode electrode is formed on the cathode layer and a surface of the impurity layer. The anode electrode is formed on a lower surface of the anode layer.

According to the voltage-driven thyristor of the seventeenth aspect, the on-gates and the off-gates are disposed alternately. Therefore, a rate of the on-gates can be larger than that in the prior art improvement already described. This enables more uniform and efficient supply of carriers from the collector layer into the first base layer. This enables reduction of a time required for setting the voltage-driven thyristor to the on-state.

According to a method of manufacturing a voltage-driven thyristor of an eighteenth aspect, a second semiconductor layer of a second conductivity type is formed on a first semiconductor layer of a first conductivity type. Impurities of the first conductivity type are introduced into a surface of the second semiconductor layer to form a third semiconductor layer of the first conductivity type. Impurities of the second conductivity type are introduced into a whole surface of the third semiconductor layer to form a fourth semiconductor layer of the second conductivity type. Impurities of the first conductivity type are selectively introduced into a surface of the fourth semiconductor layer to form a fifth semiconductor layer. First and second trenches are formed. The first trench extends through the fifth and fourth semiconductor layers and has a bottom surface located in the third semiconductor layer. The second trench extends up to the second semiconductor layer through the fifth, fourth and third semiconductor layers. First and second gate electrodes are formed on inner surfaces of the first and second trenches with insulating films therebetween, respectively. An insulating layer is formed on the first and second gate electrodes. A cathode electrode is formed on a surface of the fifth semiconductor layer and a portion of the surface of the fourth semiconductor layer. An anode electrode is formed on a lower surface of the first semiconductor layer.

The method of manufacturing the voltage-driven thyristor of a nineteenth aspect is premised on that the third semiconductor layer includes first and second regions. The first region has a first diffusion depth from the surface of the third semiconductor layer. The second region has a second diffusion depth from the surface of the third semiconductor layer which is smaller than the first diffusion depth.

The step of forming the third semiconductor layer includes the steps of selectively introducing impurities of the first conductivity type into the surface of the second semiconductor layer and thereby effecting a diffusion process for forming the first region, and introducing impurities of the first conductivity type into the whole surface of the second semiconductor layer and diffuse the impurity of the first conductivity type up to the second diffusion depth for forming the second region.

According to the method of manufacturing the voltage-driven thyristor of the nineteenth aspect, the impurity layer (a first region) and the third layer (a second region) are formed at different steps. Thereby, a concentration of impurities can be high regardless of a concentration of the third semiconductor layer. Therefore, a high impurity concentration region can be formed under the first trench. This can enhance an efficiency with which carries are supplied to a channel of an MOS transistor operating as a major component for setting the voltage-driven thyristor to the off-state. Thereby, it is possible to reduce a time required for setting the voltage-driven thyristor to the off-state.

According to the method of manufacturing the voltage-driven thyristor of the twentieth aspect, the third semiconductor layer is formed to have a uniform depth by introducing impurities of the first conductivity type into the whole surface of the second semiconductor layer and effecting a diffusion process.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Embodiments of the invention will be described below with reference to FIGS. 1–23.

First Embodiment

Figure 1:
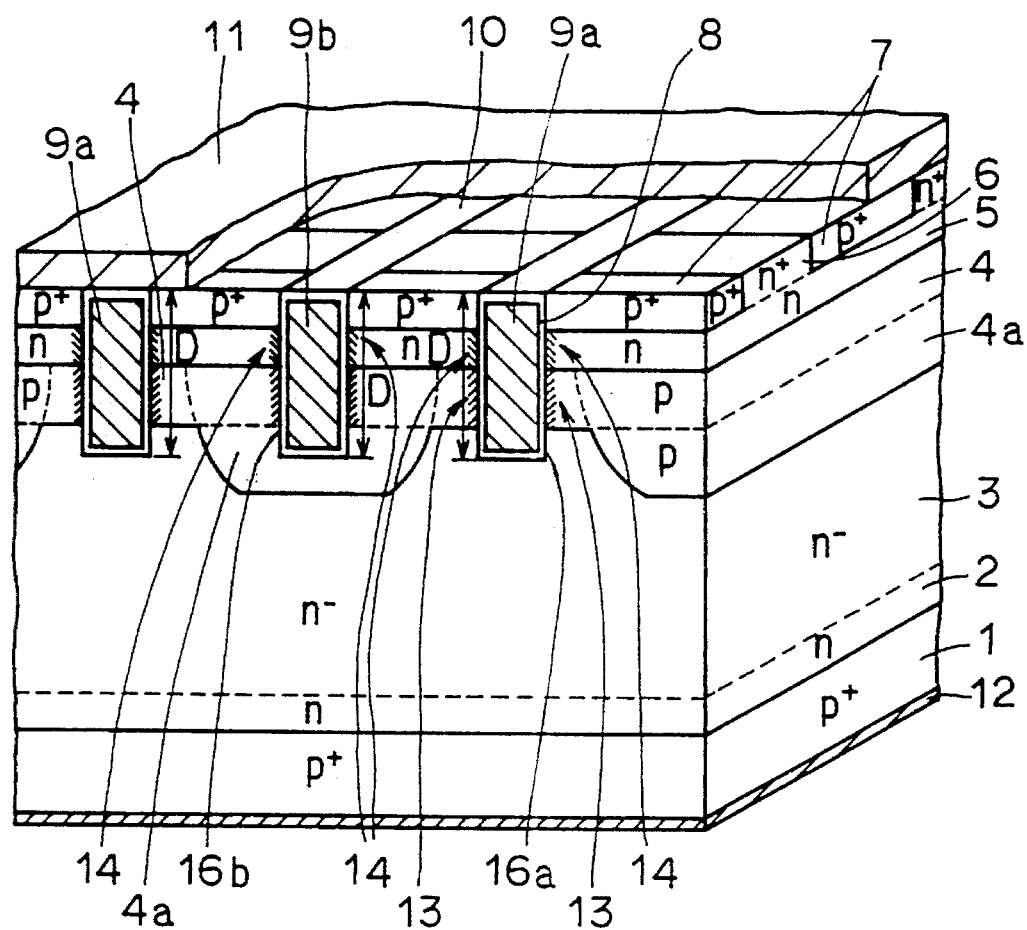
FIG. 1 is a perspective view showing a voltage-driven thyristor of a first embodiment of the invention.

A first embodiment of the invention will now be described below with reference to FIGS. 1–17. FIG. 1 is a perspective view partly in section showing a voltage-driven thyristor of the first embodiment of the invention. Referring to FIG. 1, an n-buffer layer 2 is formed on a p$^+$-anode layer 1. An anode electrode 12 is formed on the lower surface of the p$^+$-anode layer 1. The anode electrode 12 may be made of metal such as aluminum.

An n$^-$-base layer 3 is formed on n-buffer layer 2. On n$^-$-base layer 3, there are formed a p-base layer 4 and a p-type impurity layer 4a. An n-cathode layer 5 is formed on p-base layer 4. On a surface of n-cathode layer 5, there are selectively formed n$^+$-cathode layers 6 as well as p$^+$-impurity layers 7.

There are formed first trenches 16a of a depth D which extend through p$^+$-impurity layer 7, n-cathode layer 5, n$^+$-cathode layer 6 and p-base layer 4 into base layer 3. A first gate electrode (turn-on gate) 9a is formed on an inner surface of each first trench 16a with a gate oxide film 8 therebetween.

There are also formed second trenches 16b of a depth D which extend through p$^+$-impurity layer 7, n-cathode layer 5 and n$^+$-cathode layer 6 and have bottom surfaces located in p-type impurity layer 4a. A second gate electrode 9b is formed on an inner surface of each second trench 16b with the gate oxide film 8 therebetween. Second and first gate electrodes 9b and 9a may be made of polysilicon containing impurity introduced thereinto. First and second gate electrodes 9a and 9b are electrically connected at the end of trenches.

Cap oxide films 10 are formed on the first and second gate electrodes 9a and 9b. A cathode electrode 11 is formed on cap oxide films 10, p$^+$-impurity layers 7 and n$^+$-cathode layers 6. Cathode electrode 11 may be made of metal such as aluminum.

Figure 2:
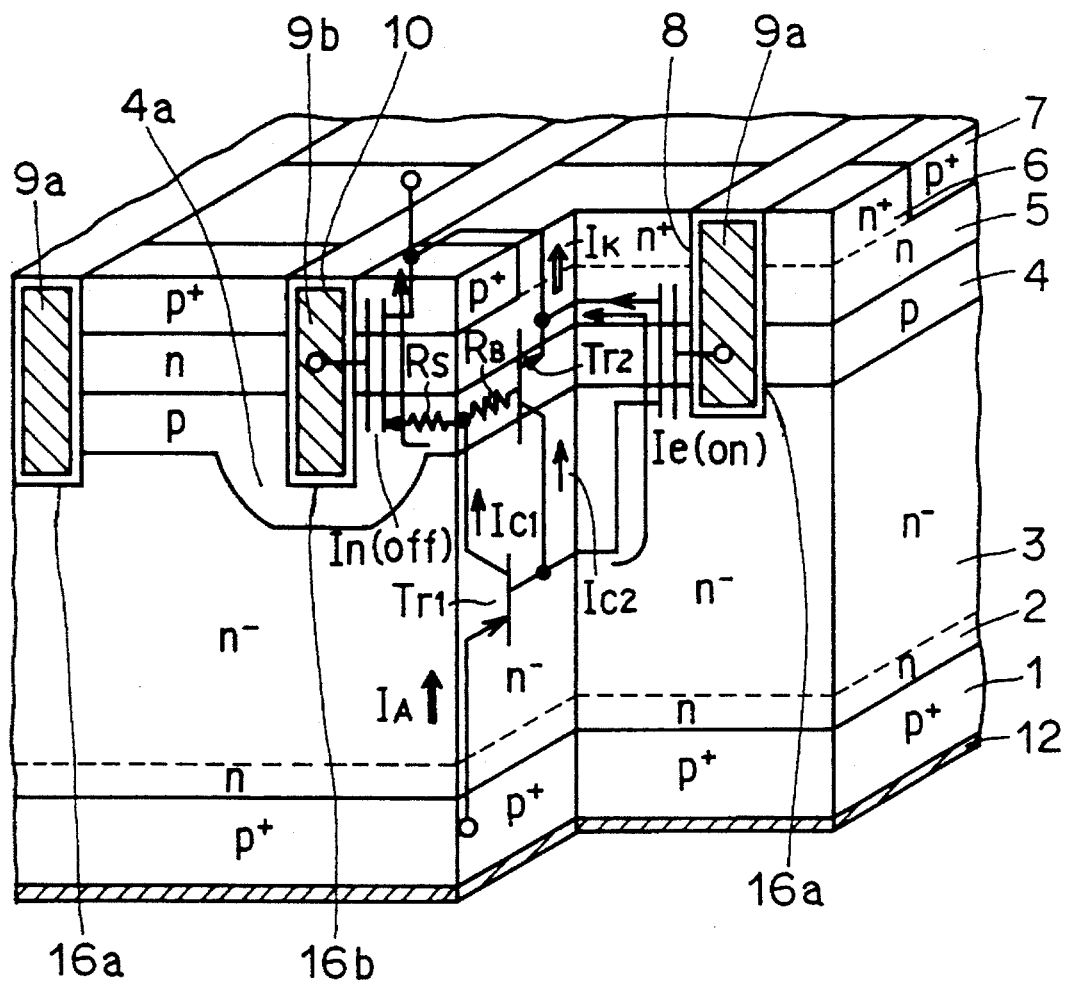
FIG. 2 schematically shows an operation principle of the voltage-driven thyristor of the first embodiment of the invention.

Referring now to FIG. 2, an operation of the voltage-driven thyristor of the first embodiment having the above structure will be described below. FIG. 2 shows an operation principle of the voltage-driven thyristor of the first embodiment described above.

The on-state will first be described below with reference to FIG. 2. In order to shift to the on-state, a positive voltage is applied to first and second gate electrodes 9a and 9b. Thereby, an n-channel MOS transistor near the side wall of first trench 16a is turned on, so that a current Ie flows in the n-channel MOS transistor. Thus, electrons flow into n$^-$-base layer 3 through this n-channel MOS transistor.

Thereby, a pnp transistor Tr1 is turned on, and a current $I_A$ flows through pnp transistor Tr1. As pnp transistor Tr1 is turned on, an npn transistor Tr2 is also turned on, so that a current $I_k$ flows. Owing to the turn-on of the pnp transistor Tr1 and npn transistor Tr2 in this manner, the thyristor is turned on, so that the main current flows through the voltage-driven thyristor.

Then, the off-state will be described below. The off-state is attained by applying a negative potential to first and second gate electrodes 9a and 9b. By application of the negative voltage to the first and second gate electrodes 9a and 9b, the n-channel MOS transistor near the side wall of first trench 16a is turned off, and the p-channel MOS transistor near the side wall of second trench 16b is turned on. Thereby, holes are drawn from p-base layer 4. Consequently, a depletion layer spreads in the junction portion between p-base layer 4 n$^-$-base layer 3, so that the voltage-driven thyristor is shifted to the off-state.

Figure 3:
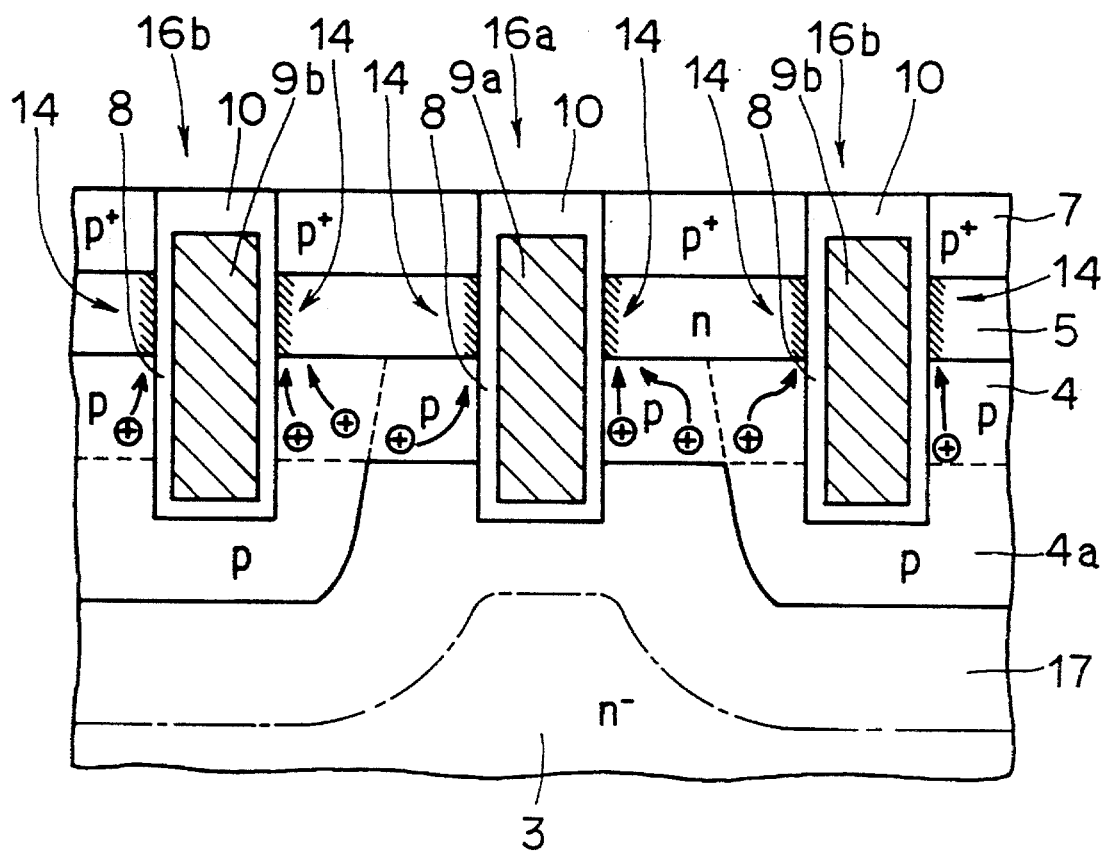
FIG. 3 schematically shows a first feature of the voltage-driven thyristor of the first embodiment of the invention.
Figure 4:
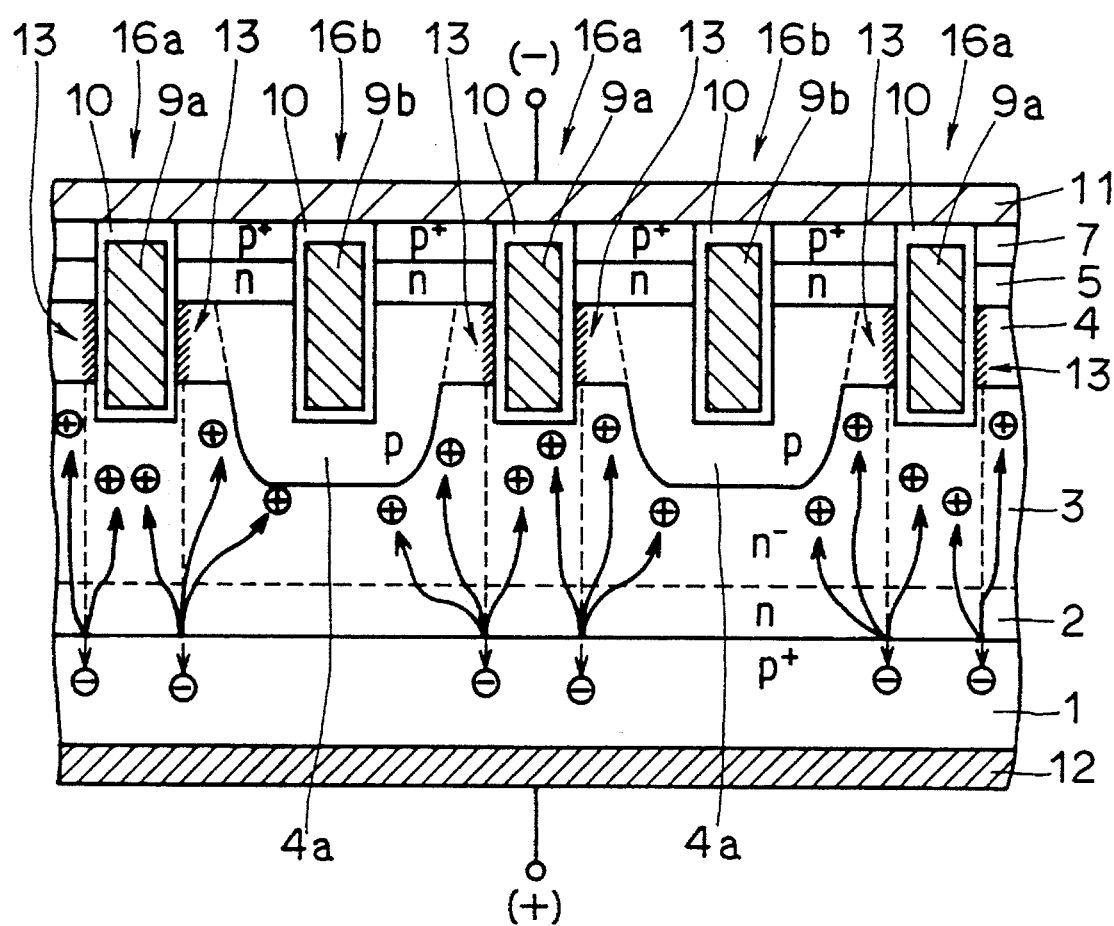
FIG. 4 schematically shows a second feature of the voltage-driven thyristor of the first embodiment of the invention.

Then, referring to FIGS. 3 and 4, a feature of the voltage-driven thyristor of the first embodiment described above will be described below more in detail. FIGS. 3 and 4 are cross sections schematically showing a distinctive operation of the voltage-driven thyristor of the first embodiment.

Referring first to FIG. 3, p-type impurity layer 4a is formed under second trenches 16b. P-type impurity layer 4a is protruded into n⁻-base layer 3. A depth of p-type impurity layer 4a is preferably larger than a depth of first trench 16a. FIG. 3 shows a state where the voltage-driven thyristor is turned off and a depletion layer 17 spreads into the junction boundary between p-type impurity layer 4a and n⁻-base layer 3 and between p-base layer 4 and n⁻-base layer 3. P-type impurity layer 4a is deep and protruded into n⁻-base layer 3 as shown in FIG. 3, so that depletion layer 17 can spread into a deep position. Thereby, depletion layer 17 can cover the bottom edges of first trench 16a deeply. Therefore, concentration of an electric field at the bottom edges of first trench 16a can be effectively prevented. Therefore, the voltage-driven thyristor can have a high reliability.

Owing to arrangement of p-type impurity layer 4a at opposite sides of first trench 16a, depletion layers 17, which spread at the junctions between p-type impurity layer 4a and n⁻-base layer 3, are joined under first trench 16a when the voltage-driven thyristor is in the off-state. Thereby, depletion layer 17 can be formed at a deep position under first trench 16a. In connection with this, the voltage-driven thyristor can have high reliability similarly to the case described before.

In FIG. 3, one first trench 16a is formed between the adjacent trenches 16b. However, two or more first trenches 16a may be formed between second trenches 16b. Also in this case, p-type impurity layers 4a are formed at an appropriate depth so that depletion layer 17 can cover the bottom edges of these first trenches 16a. Thereby, the voltage-driven thyristor with high reliability is obtained.

During shift to the off-state, inverted layers are formed at second channel forming regions 14. Holes are drawn through second channel forming regions 14 from p-base layer 4 and p-type impurity layer 4a into p⁺-impurity layer 7. In connection with this, p-base layer 4 located immediately under second channel forming region 14 has the highest concentration of impurities according to the structure of the first embodiment shown in FIG. 3.

The reason of the above is that the region at which p-base layer 4 and p-type impurity layer 4a overlap with each other is located immediately under second channel forming region 14. Thus, p-base layer 4 of a high concentration exists immediately under second channel forming region 14 according to the structure shown in FIG. 3. Therefore, a resistance against holes, which are being drawn from p-base layer 4 when the voltage-driven thyristor is set to the off-state, can be small. This enables quick setting of the voltage-driven thyristor to the off-state.

Referring to FIG. 4, first trenches 16a and second trenches 16b are formed alternately in the voltage-driven thyristor of the first embodiment shown in FIG. 1. This arrangement enables quick setting of the voltage-driven thyristor to the on-state.

Figure 29:
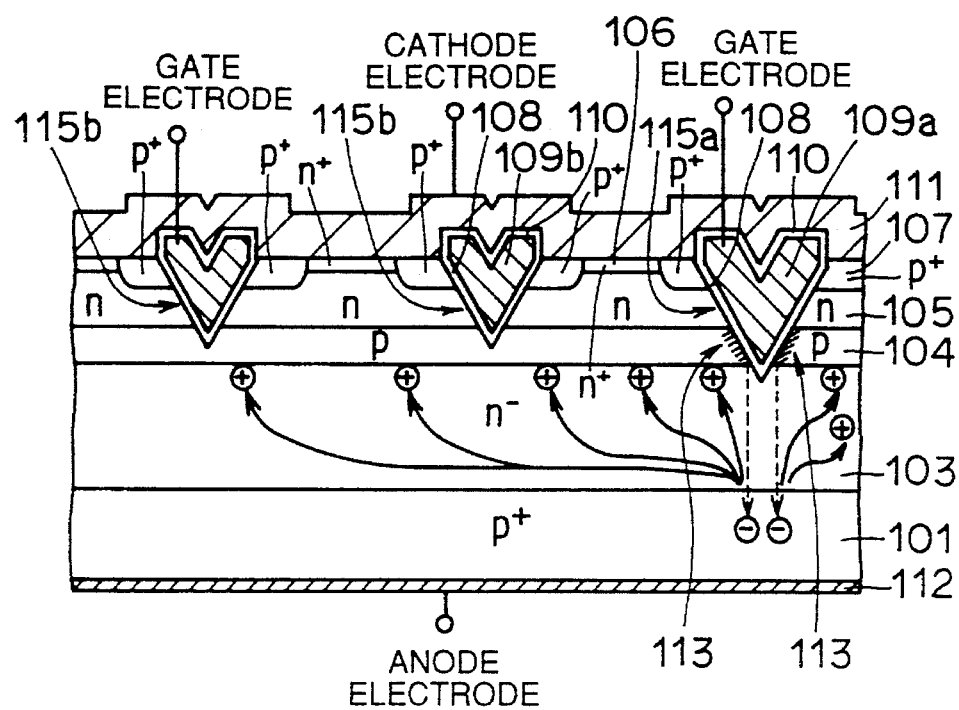
FIG. 29 is a cross section for showing a first problem of the improved voltage-driven thyristor.
Figure 30:
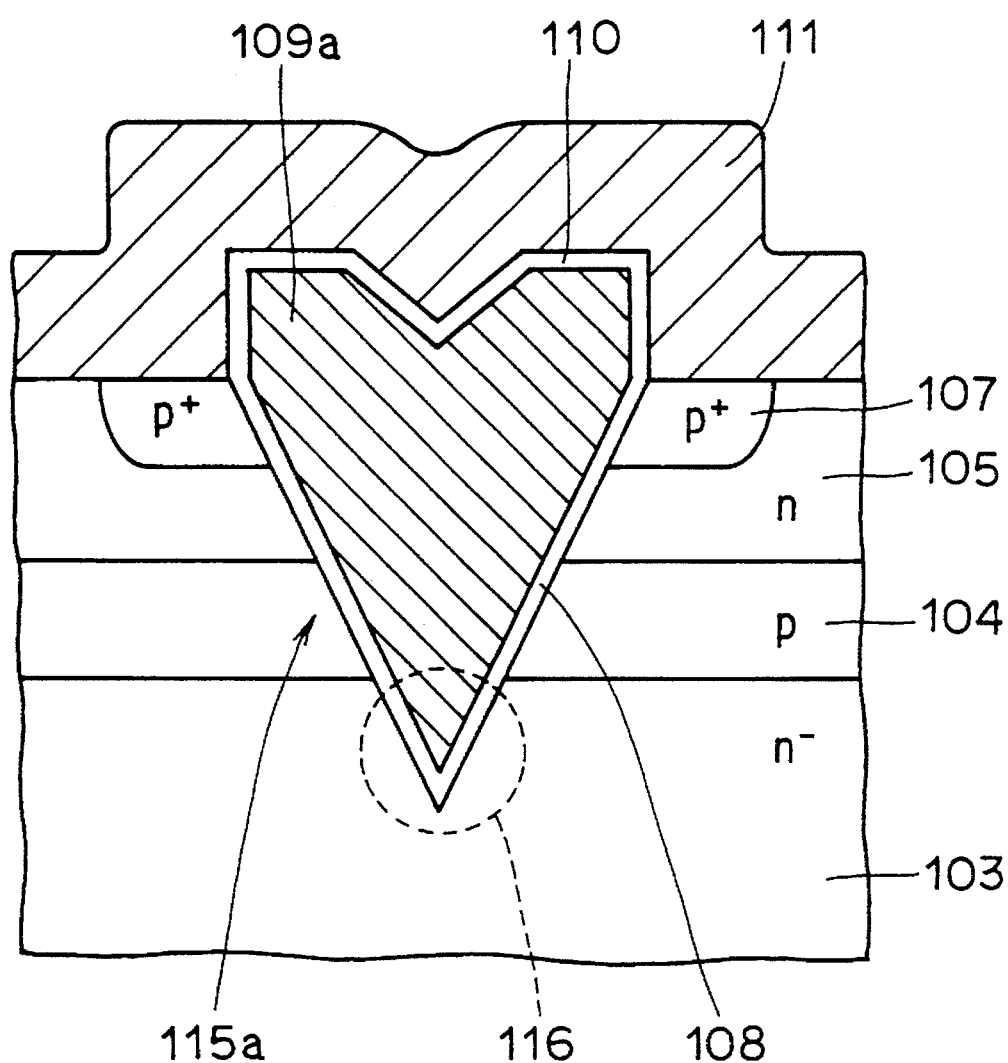
FIG. 30 is a cross section for showing a second problem of the improved voltage-driven thyristor.

The reason of the above will be described below with reference to FIG. 4. Referring to FIG. 4, holes are supplied from p⁺-anode layer 1 to n⁻-base layer 3 through the same position or path in the p⁺-anode layer 1 as that through which electrons move into the p⁺-anode layer 1. These electrons have been injected into n⁻-base layer 3 through the channel region of the n-channel MOS transistor formed at the side wall of first trench 16a. Since the voltage-driven thyristor of the first embodiment shown in FIG. 4 is provided with first and second trenches 16a and 16b which are formed alternately, a degree of integration of the n-channel MOS transistors can be higher than that of the conventional improvement shown in FIG. 29. The high degree of integration of the n-channel MOS transistors enables a number of positions through which holes are supplied from p⁺-anode layer 1 into n⁻-base layer 3. Thereby, holes can be supplied efficiently from p⁺-anode layer 1 into n⁻-base layer 3. Therefore, a time required for setting the voltage-driven thyristor to the on-state can be shorter than that of the conventional improvement described before.

Figure 5:
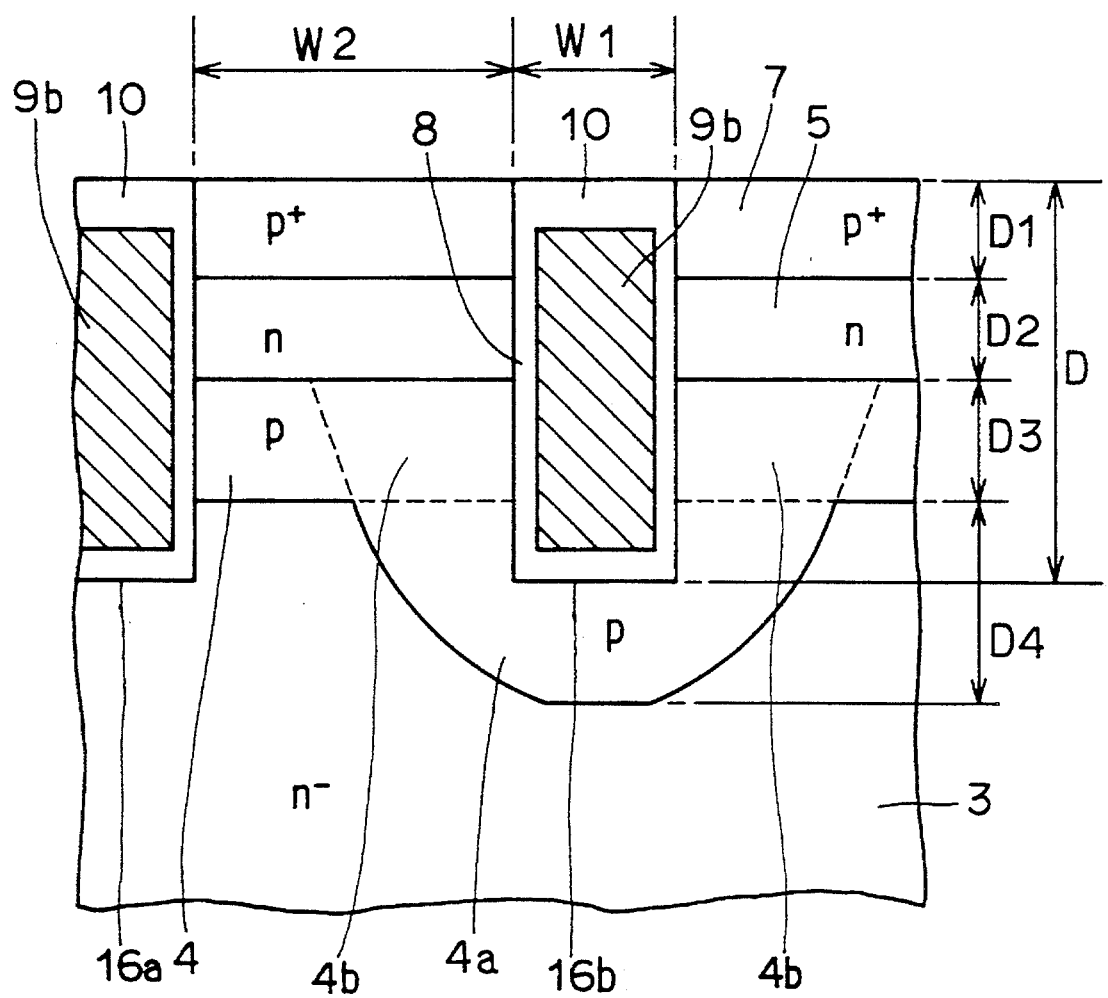
FIG. 5 is an enlarged cross section of and around a second trench in the voltage-driven thyristor of the first embodiment of the invention.

Referring to FIG. 5, a structure near the second trench 16b will be described below in greater detail. Numerical limits which will be described below are premised on that a breakdown voltage of the voltage-driven thyristor is in a range from about 400 V to about 500 V. FIG. 5 is an enlarged cross section showing a structure of and around second trench 16b.

Referring to FIG. 5, an open width W1 of second trench 16b is about 1 μm. A diffusion depth D1 of p⁺-impurity layer 7 is preferably not more than about 1 μm. A diffusion depth D2 of n-cathode layer 5 is preferably about 1.5 μm. A diffusion depth D3 of p-base layer 4 is preferably in a range from about 1.5 μm to about 2 μm. A diffusion depth D4 of p-type impurity layer 4a is preferably in a range from about 2 μm to about 3 μm. In this case, a diffusion depth of p-type impurity layer 4a from the upper surface of impurity layer 7 is in a range from about 6 μm to about 7 μm.

First and second trenches 16a and 16b preferably have a depth in a range from about 5 μm to about 6 μm. Also, a distance W2 between first and second trenches 16a and 16b is in a range from about 5 μm to about 10 μm. The reason of this is that p-type impurity for p-type impurity layer 4a is diffused into a deep position and hence the p-type impurity spreads also in a lateral direction.

A concentration of p-base layer 4 is approximately in a range from $10^{16} cm^{-3}$ to $10^{17} cm^{-3}$. This range is determined based on a threshold voltage Vth of the n-channel MOS transistor formed at the side wall of first trench 16a. A concentration of p-type impurity layer 4a is approximately in a range from $10^{16} cm^{-3}$ to $10^{18} cm^{-3}$ or more. Thereby, the region 4b at which p-base layer 4 and p-type impurity layer 4a overlap with each other has the highest concentration in a range from $2 \times 10^{16} cm^{-3}$ to $10^{18} cm^{-3}$. This region 4b is located immediately under the channel forming region of the p-channel MOS transistor which operates as a major component when the voltage-driven thyristor is set to the off-state. Therefore, holes can be supplied efficiently to the p-channel MOS transistor.

Figure 15:
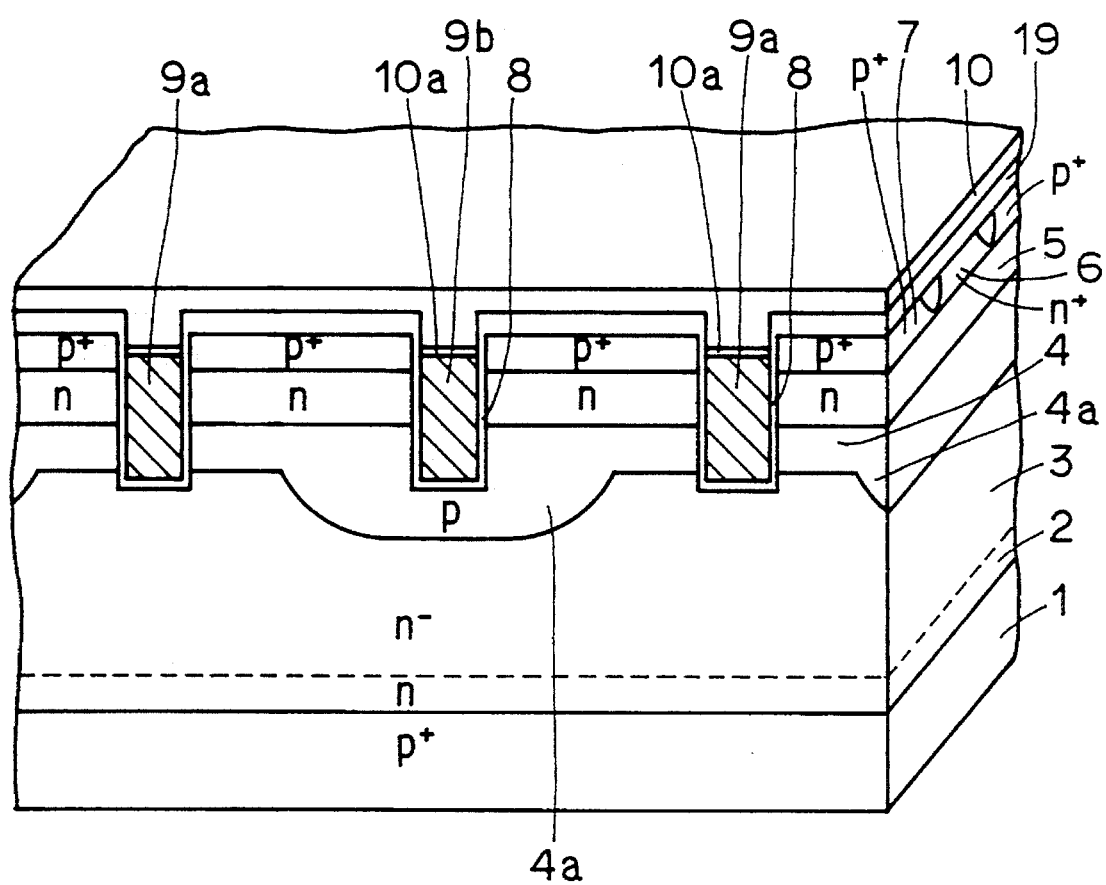
Figure 16:
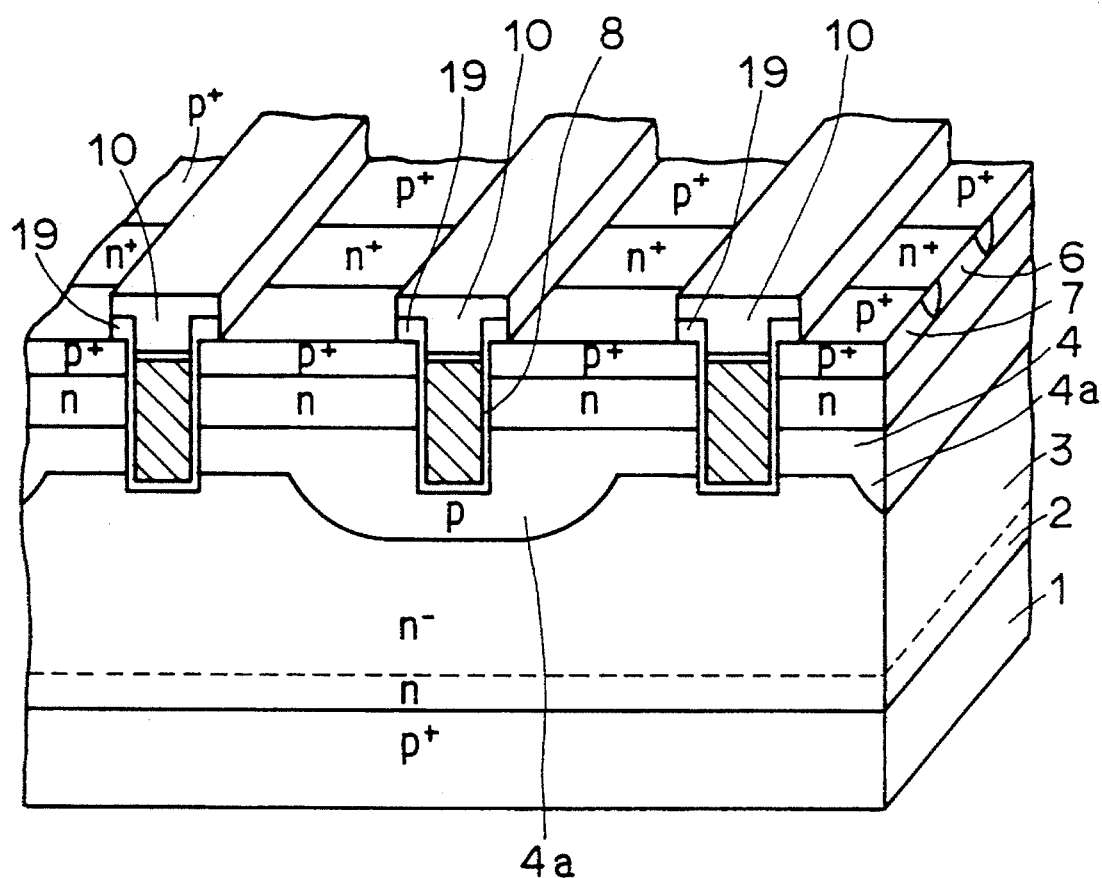
Figure 17:
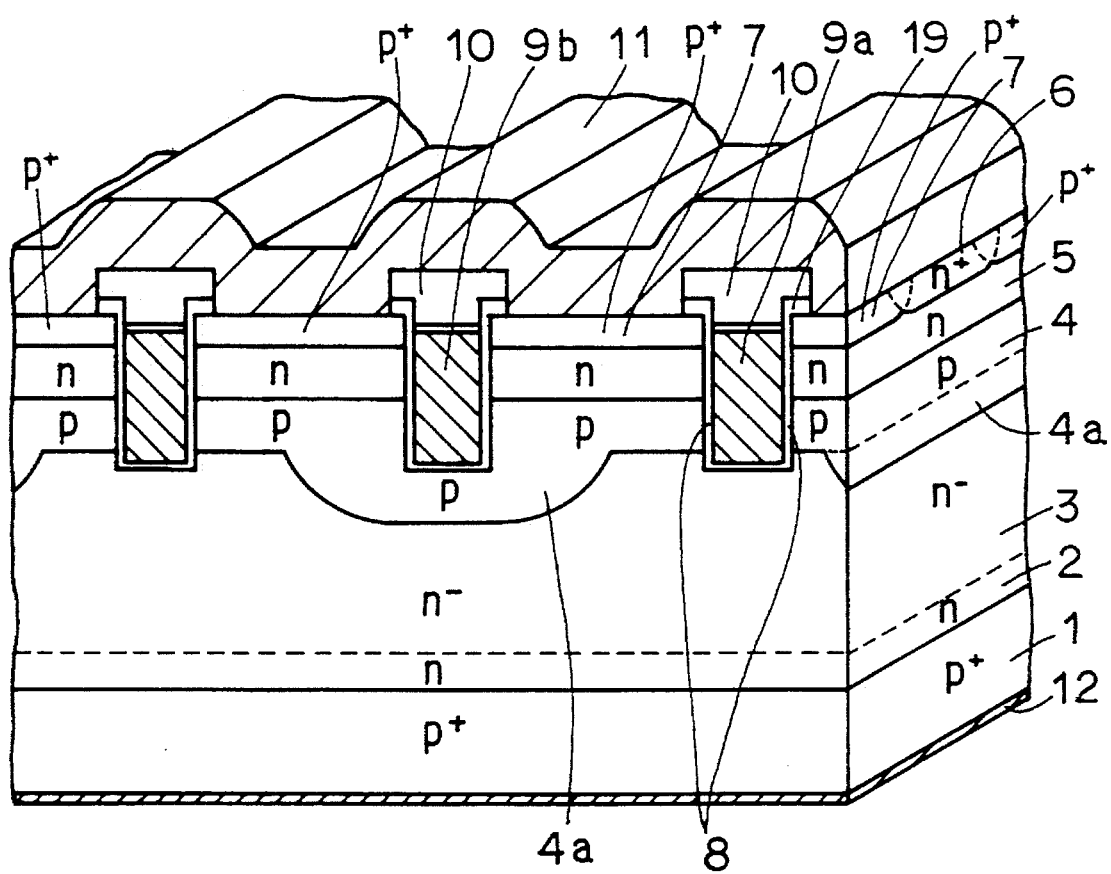

Referring now to FIGS. 6 to 17, a method of manufacturing the voltage-driven thyristor of the first embodiment of the invention will be described below. FIGS. 6 to 10 are perspective views showing 1st to 5th steps in a process of manufacturing the voltage-driven thyristor of the first embodiment, respectively. FIGS. 11A and 11B are perspective views showing modifications of a formation pattern of p⁺-impurity layers 7. FIGS. 12 to 17 are perspective views showing 6th to 11th steps in a process of manufacturing the voltage-driven thyristor of the first embodiment. The voltage-driven thyristor completed through the manufacturing process which will be described below has, for example, the structure including relatively large cap oxide films 10 as shown in FIG. 17. Cap oxide films 10 partially fill first and second trenches or grooves 16a and 16b so as to complete the voltage-driven thyristor of the first embodiment shown in FIG. 1.

Figure 6:
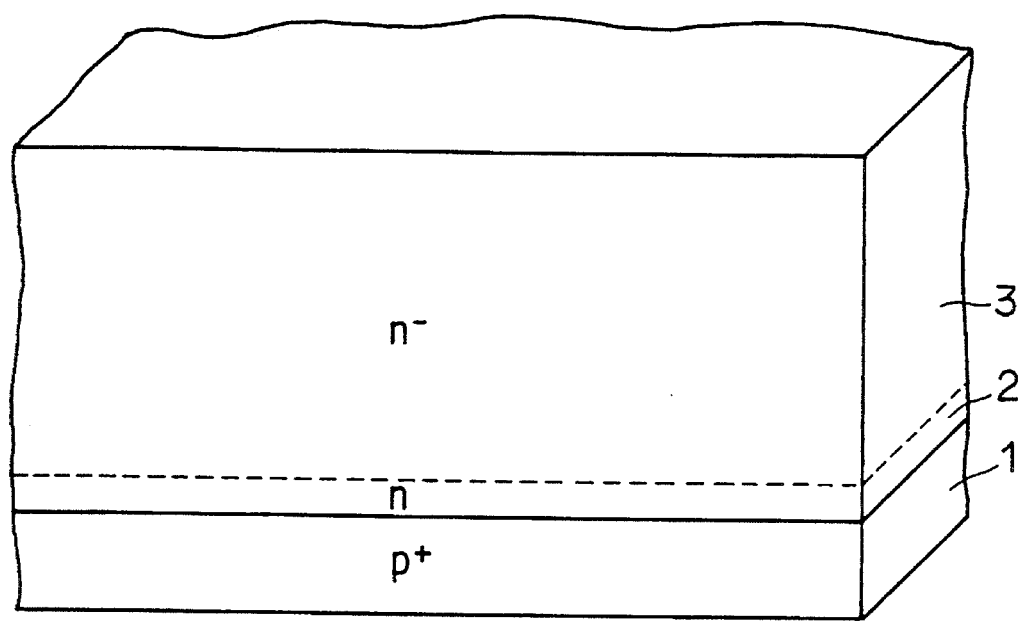
FIGS. 6–10 are perspective views showing 1st to 5th steps in a process of manufacturing the voltage-driven thyristor of the first embodiment of the invention, respectively.
Figure 7:
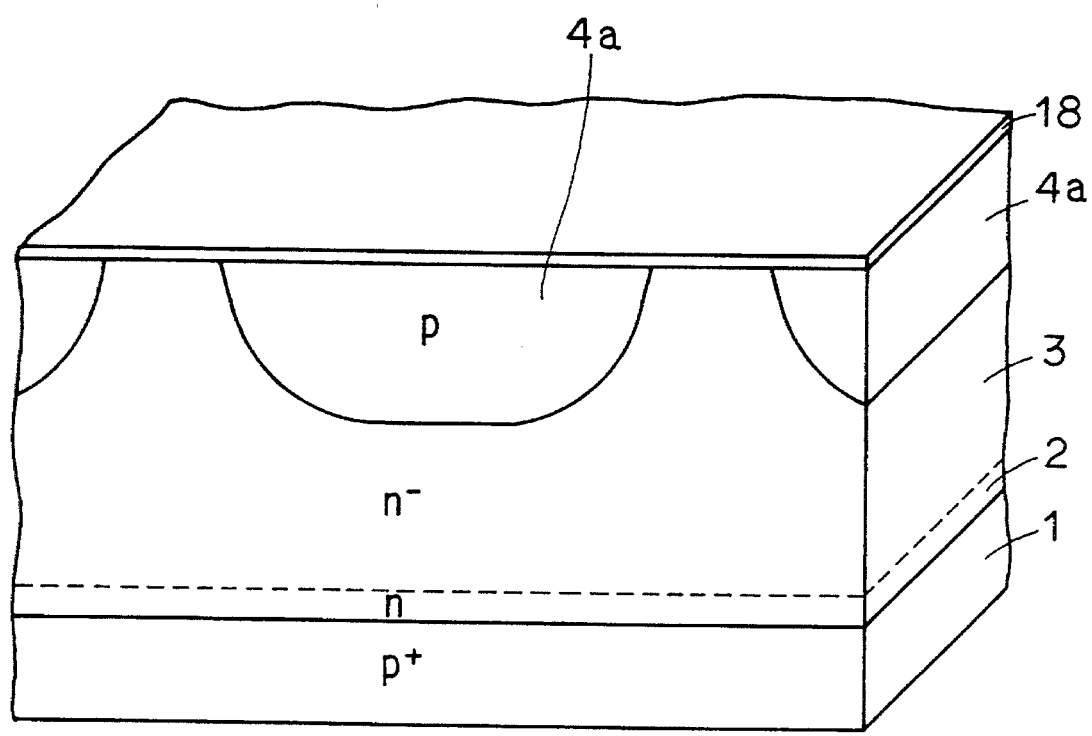

Referring to FIG. 6, n-buffer layer 2 and n⁻-base layer 3 are successively formed on the p⁺-anode layer 1 by an epitaxial growth method. Then, referring to FIG. 7, an oxide film 18 is formed on the surface of n-base layer 3. Through the oxide film p-type impurities are selectively introduced into n-base layer 3, for example, by the ion implantation or diffusion from gas. A thermal diffusion process is effected to form p-type impurity layer 4a preferably at a concentration of about $10^{16}/cm^3$ to $10^{18}/cm^3$.

Figure 8:
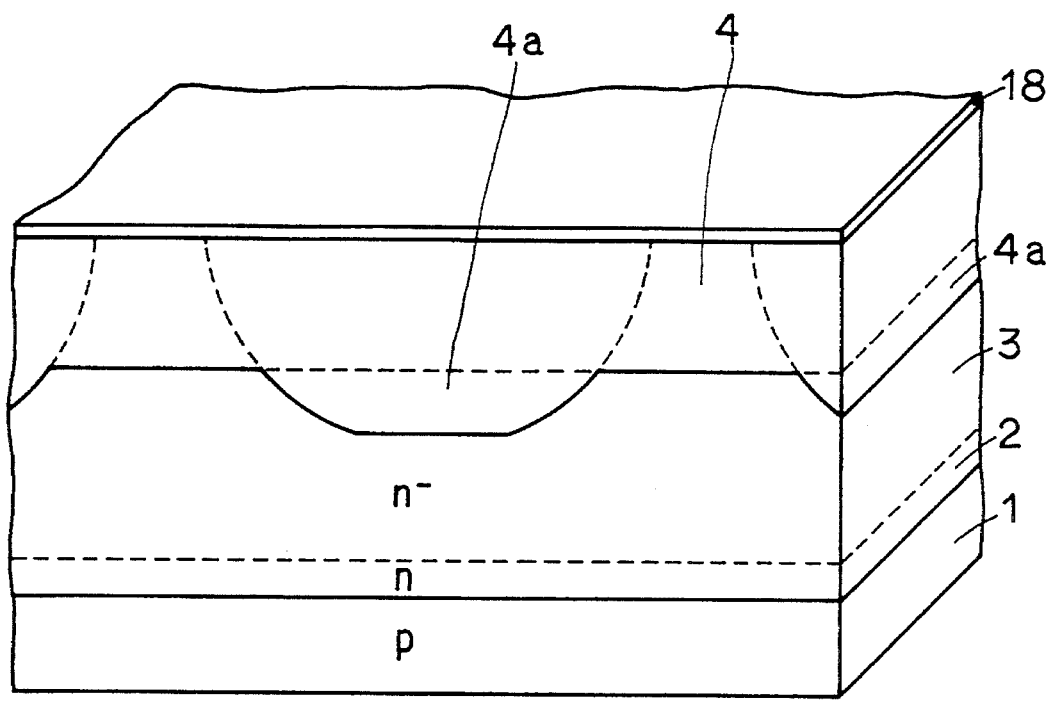

Referring to FIG. 8, p-type impurities are introduced through oxide film 18 into the whole surface of n⁻-base layer 3. A thermal diffusion process is effected to form p-base layer 4 preferably at a concentration of about $10^{16}/cm^3$ to $10^{17}/cm^3$. P-base layer 4 thus formed has a diffusion depth smaller than that of p-type impurity layer 4a. As described above, p-base layer 4 and p-type impurity layer 4a are formed at different steps, so that it is possible to form the high concentration region at which p-base layer 4 and p-type impurity layer 4a overlap with each other. The side wall of second trench 16b is partially formed in this high impurity concentration region. Thereby, it is possible to increase the concentration of p-type impurities in p-base layer 4 near the side wall of second trench 16b. Therefore, it is possible to improve the turn-off characteristics of the voltage-driven thyristor.

Figure 9:
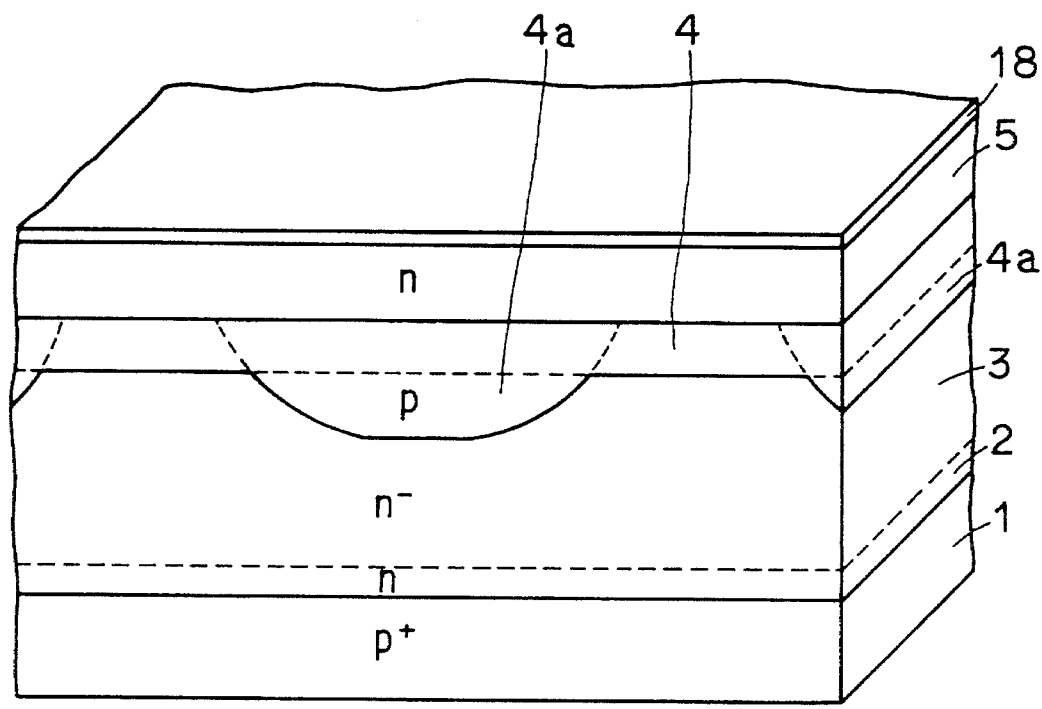

Referring to FIG. 9, n-type impurities are introduced into the whole surface of p-base layer 4. Then, a thermal diffusion process is effected to form n-cathode layer 5.

Figure 10:
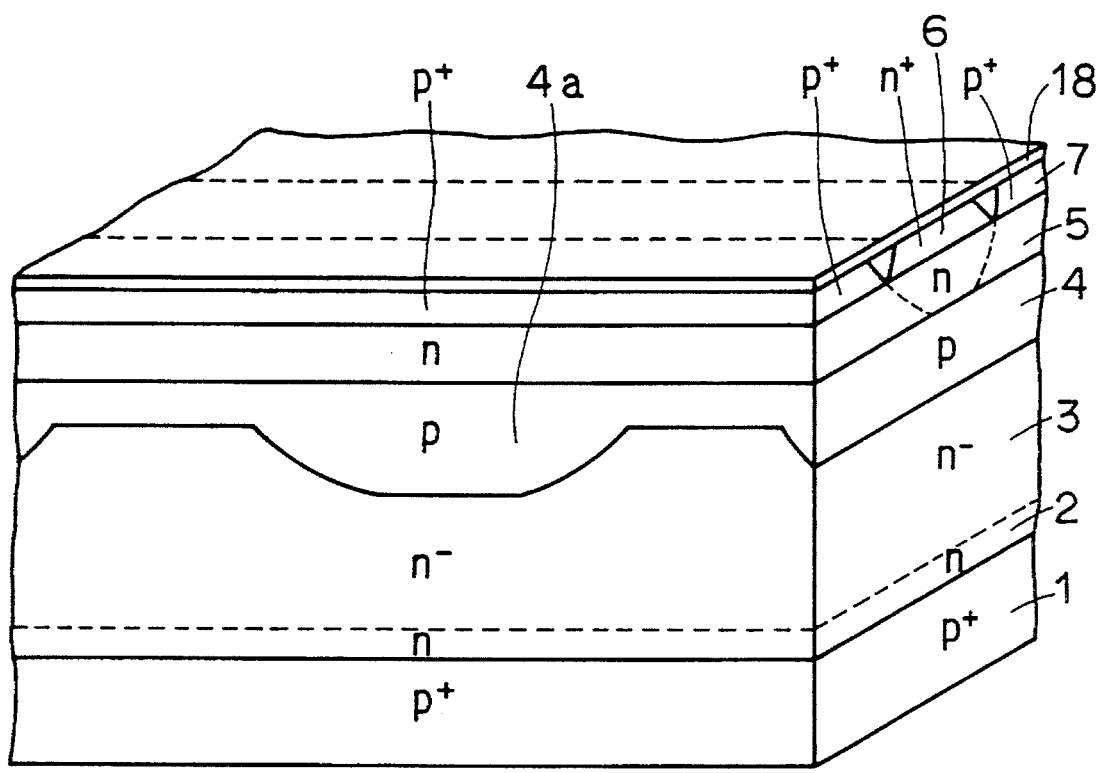
Figure 11A:
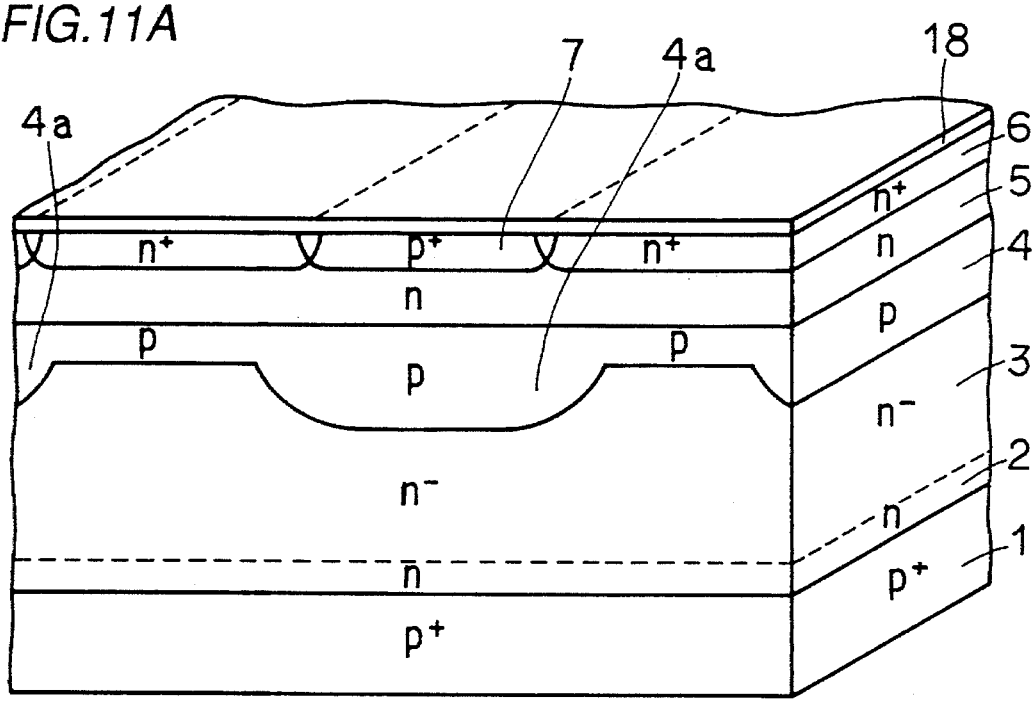
FIGS. 11A and 11B are perspective views showing modifications of the 5th steps shown in FIG. 10.
Figure 11B:
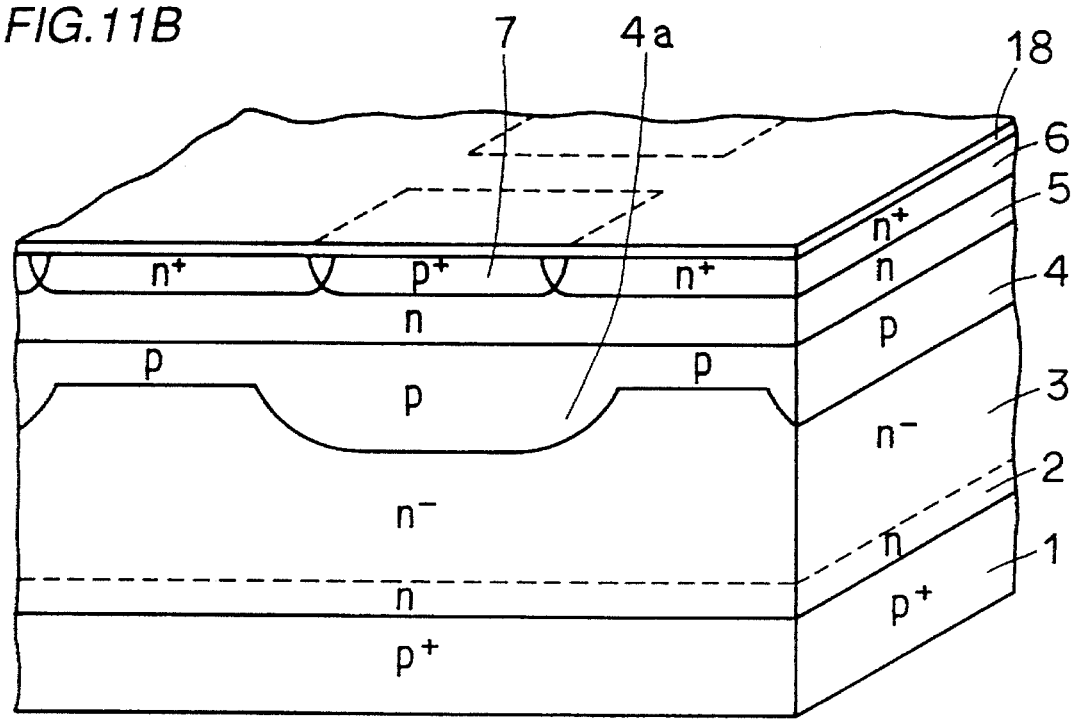

Referring to FIG. 10, n-type impurities and p-type impurities are selectively introduced into the surface of n-cathode layer 5 to form n⁺-cathode layers 6 and p⁺-impurity layers 7, respectively. N⁺-cathode layers 6 thus formed may be deep enough to reach the upper surface of p-base layer 4. As shown in FIGS. 11A and 11B, various pattern structures of p⁺-impurity layers 7 and n⁺-cathode layers 6 may be selected in accordance with required characteristics of a device.

Figure 12:
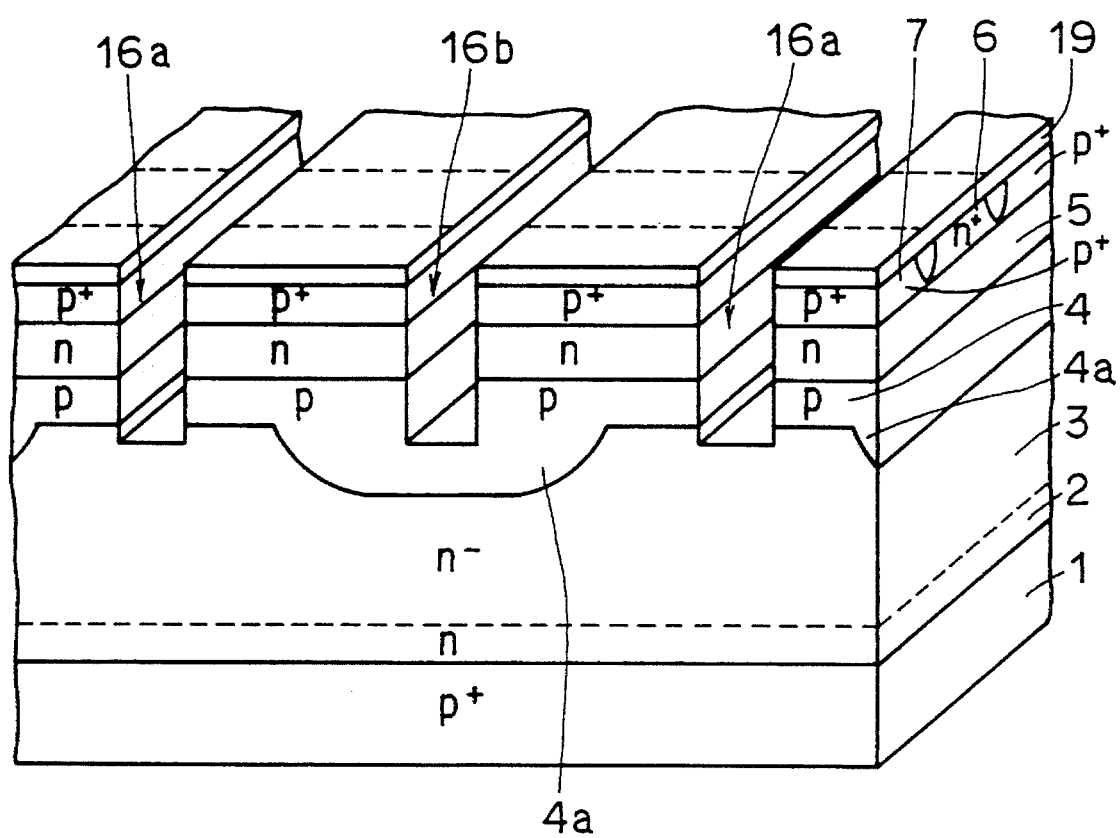
FIGS. 12–17 are perspective views showing 6th to 11th steps in a process of manufacturing the voltage-driven thyristor of the first embodiment of the invention, respectively.

Referring to FIG. 12, oxide films 19 of a predetermined thickness are formed on p⁺-impurity layers 7 and n⁺-cathode layers 6. Using oxide films 19 as a mask, etching is effected to form first and second trenches 16a and 16b. In this embodiment, since first and second trenches 16a and 16b have the same depth, they can be formed simultaneously. Thereby, the process is simplified.

Figure 13:
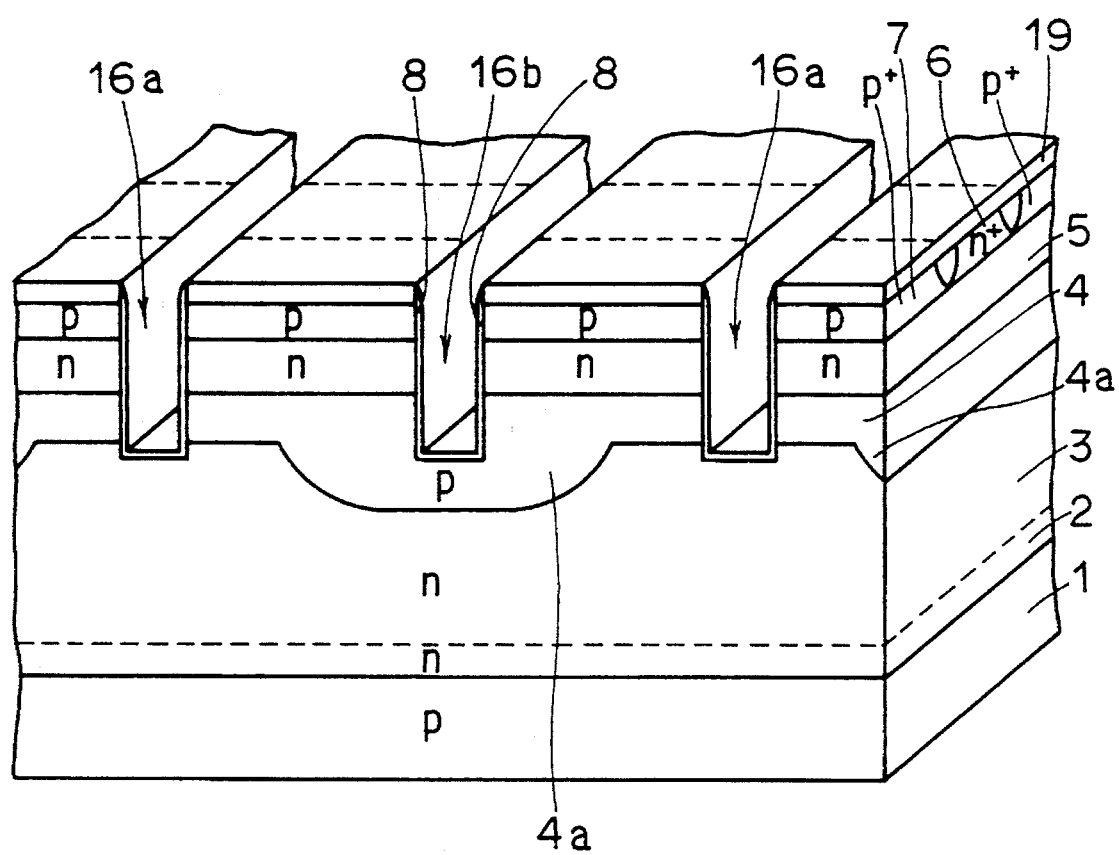
Figure 14:
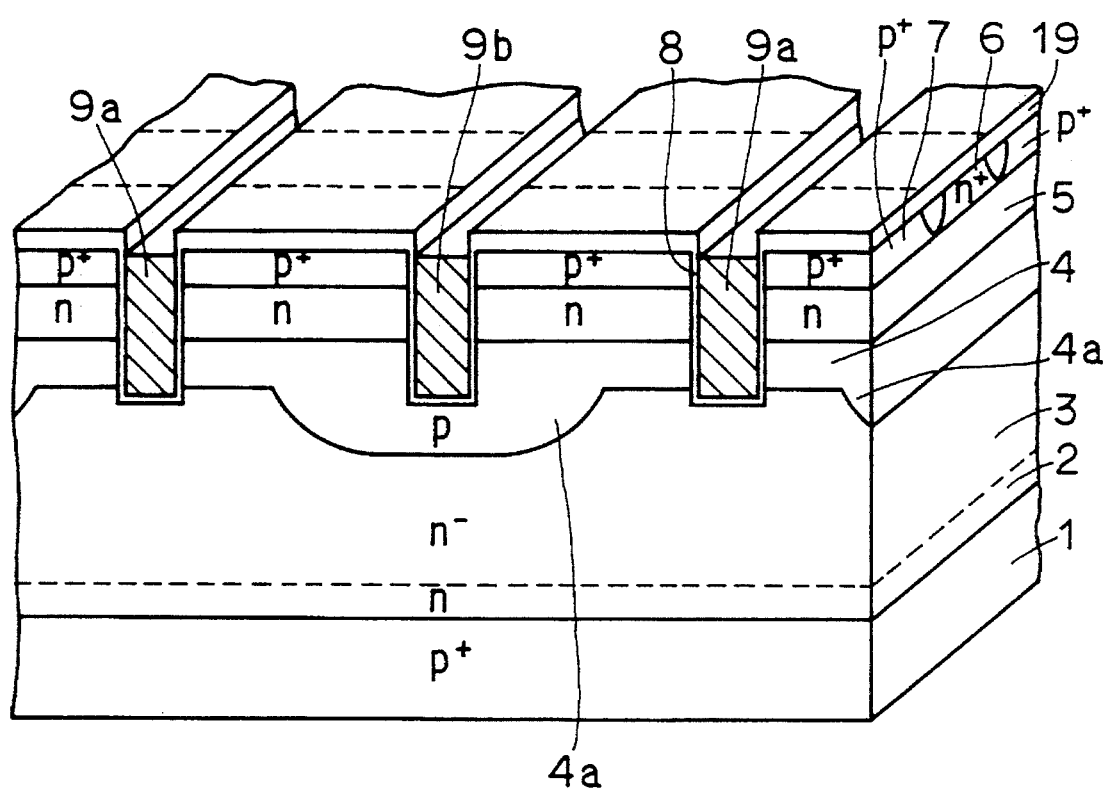

Referring to FIG. 13, a thermal oxidation method or a CVD method is used to form gate oxide films 8 in first and second trenches 16a and 16b. A polysilicon layer is deposited on oxide films 19. The polysilicon layer has a thickness enough to fill first and second trenches 16a and 16b and contains impurity doped therein. An etch-back process is effected on the polysilicon layer to form polysilicon layers 9a and 9b filling first and second trenches 16a and 16b as shown in FIG. 14. In this manner, first and second gate electrodes 9a and 9b are formed. Above polysilicon layer is left at the end of first and second trenches 16a and 16b to electrically connect first and second gate electrodes 9a and 9b.

Referring to FIG. 15, the thermal oxidation method, CVD method or the like is used to form oxide films 10a. The CVD method is used to form cap oxide film 10 on oxide films 10a and 19.

Referring to FIG. 16, the cap oxide films 10 and 19 are patterned to expose the surfaces of p⁺-impurity layers 7 and n⁺-cathode layers 6 while partially remaining oxide films 19 and cap oxide films 10 on first and second gate electrodes. Referring to FIG. 17, a sputtering method or the like is used to form cathode electrode 11 on oxide films 10, p⁺-impurity layers 7 and n⁺-cathode layers 6. The anode electrode 12 is formed on the lower surface of the p⁺-anode layer 1.

Second Embodiment

Figure 18:
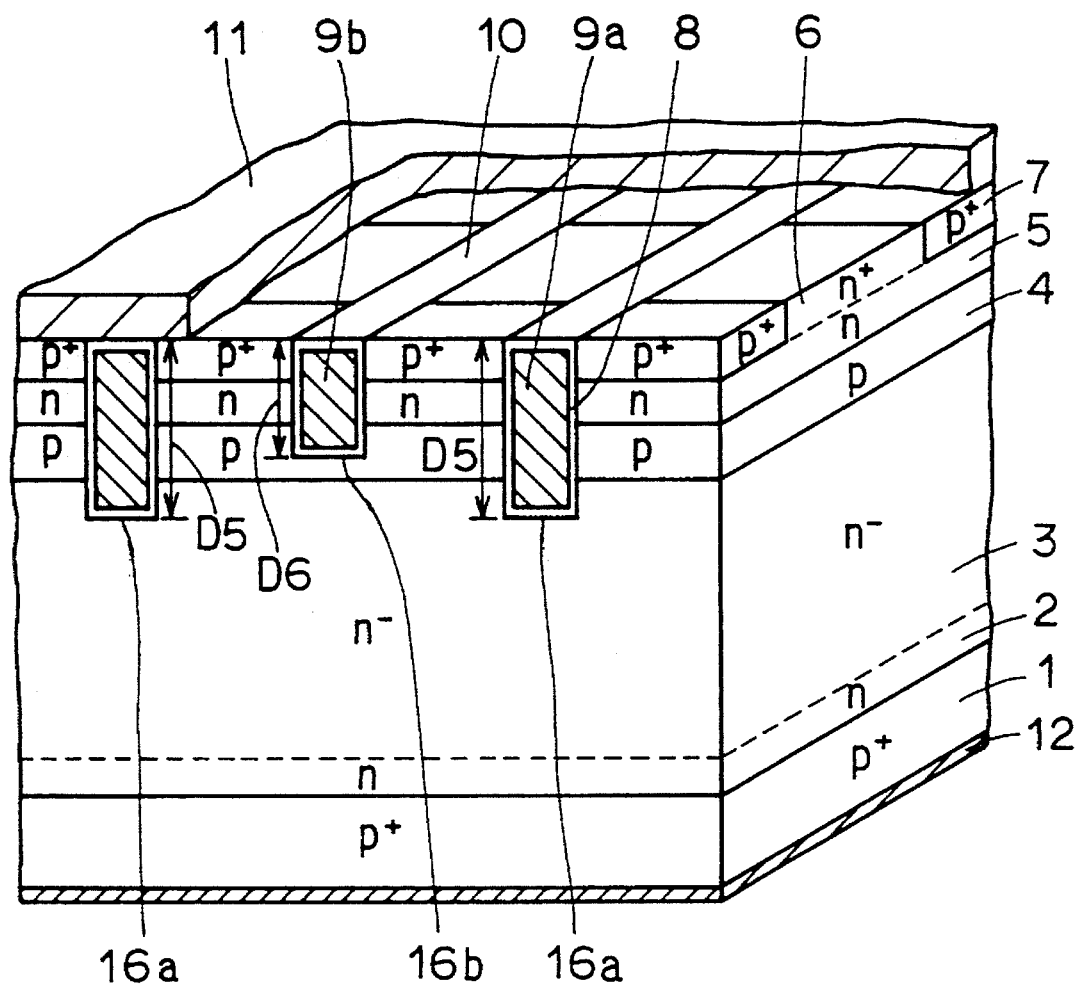
FIG. 18 is a perspective view showing a voltage-driven thyristor of a second embodiment of the invention.
Figure 19:
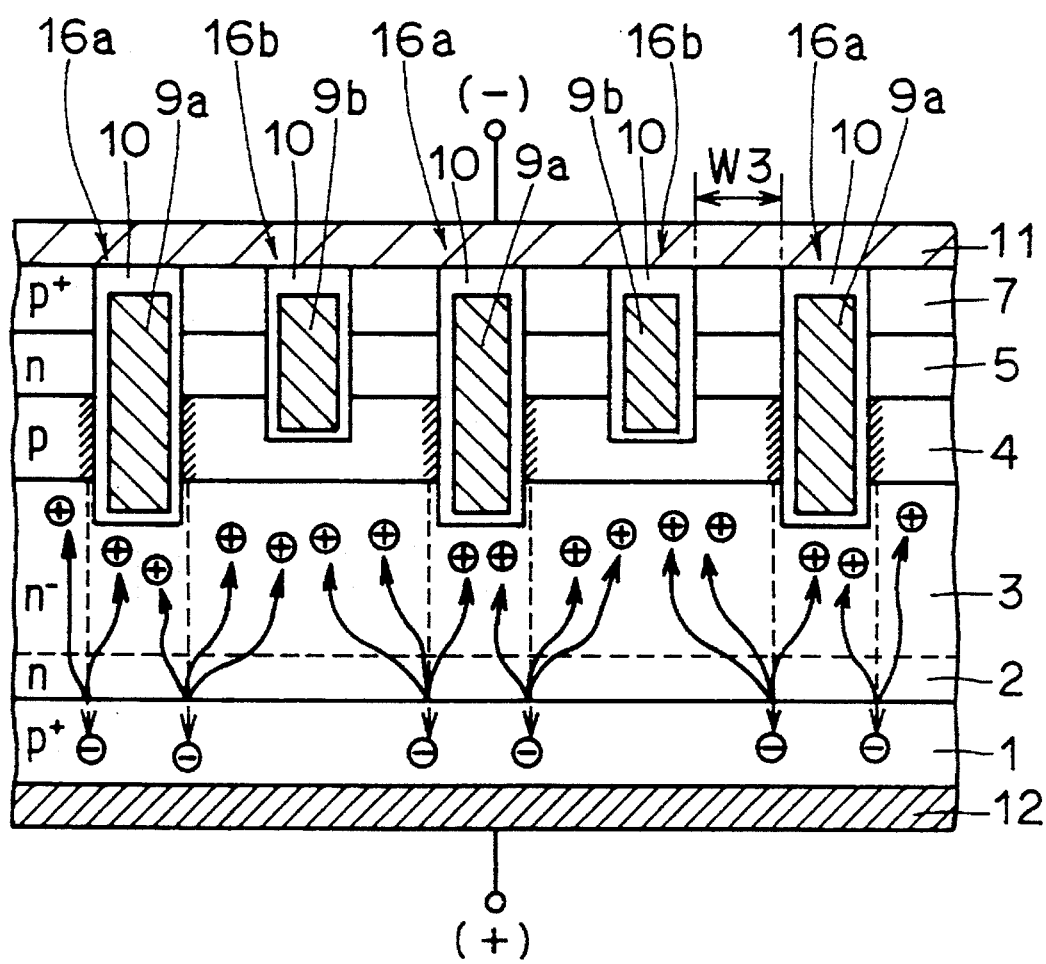
FIG. 19 schematically shows a feature of the voltage-driven thyristor of the second embodiment of the invention.

Referring now to FIGS. 18 and 19, a voltage-driven thyristor of a second embodiment of the invention will be described below. FIG. 18 is a perspective view of the voltage-driven thyristor of the second embodiment of the invention.

Referring to FIG. 18, the second embodiment is not provided with p-type impurity layer 4a in contrast to the first embodiment already described. Therefore, The junction portion between p-base layer 4 and n⁻-base layer 3 is spaced by a substantially constant distance from the surfaces of p⁺-impurity layers 7 and n⁺-cathode layers 6. Naturally, the step of forming the p-type impurity layer 4a is not required. Thus, p-base layer 4 is formed by introducing p-type impurities into the whole surface of n⁻-base layer 3.

In this embodiment, first trench 16a has a depth D5 larger than a depth D6 of second trench 16b. Therefore, first gate electrode 9a formed in first trench 16a functions as a turn-on gate, and second gate electrode 9b formed in second trench 16b functions as a turn-off gate. Other structures are the same as those of the voltage-driven thyristor of the first embodiment shown in FIG. 1. Since first and second trenches 16a and 16b have different depths, they are formed at different steps.

In the voltage-driven thyristor of this embodiment, a space between first and second trenches 16a and 16b can be smaller than that in the first embodiment. Therefore, a degree of integration of first and second trenches can be increased. Consequently, a time for setting the voltage-driven thyristor to the turn-on state can be further reduced to a value smaller than that in the first embodiment.

The reason of the above will be described below in greater detail with reference to FIGS. 5 and 19. Referring to FIG. 5 again, p-type impurity layer 4a must be diffused into a deep position in the first embodiment. Therefore, p-type impurity layer 4a inevitably spreads in a lateral direction. Accordingly, in the form shown in FIG. 5, first and second trenches 16a and 16b are spaced from each other by the relatively large distance W2 of about 5 to 10 μm.

Meanwhile, the second embodiment is not provided with p-type impurity layer 4a as can be seen from FIG. 19, so that the degree of integration of first and second trenches 16a and 16b can be increased. More specifically, a distance W3 between first and second trenches 16a and 16b can be a small value of about 2 to 3 μm. Therefore, it is possible to increase the degree of integration of the n-channel MOS transistors formed at the side walls of first trenches 16a. Accordingly, the time required for setting the voltage-driven thyristor to the on-state can be further reduced to a value smaller than that in the first embodiment.

Referring to FIGS. 20–23, modifications of the pattern of p⁺-impurity layers 7 and n⁺-cathode layers 6 will be described below.

Modification 1

Figure 20:
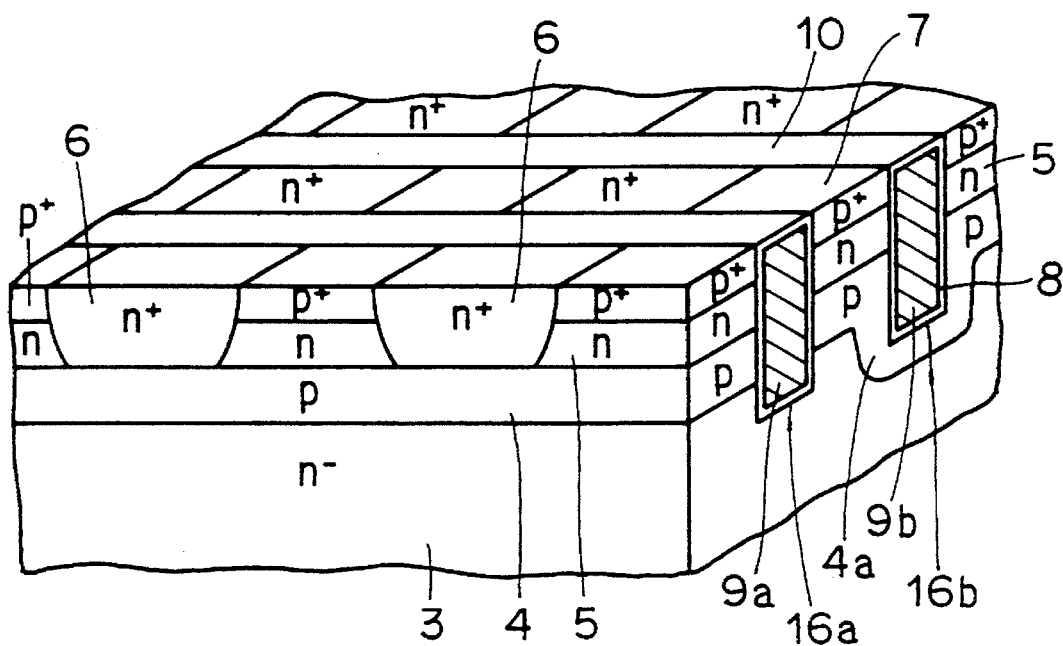
FIGS. 20–23 are perspective views showing first to fourth modifications of a pattern layout of p$^+$-impurity layers and n$^+$-cathode layers, respectively.

FIG. 20 is a perspective view showing a first modification of the pattern of p⁺-impurity layer 7 and n⁺-cathode layer 6. In this modification in FIG. 20, each n⁺-cathode layer 6 has a bottom at a deep position which reaches the upper surface of p-base layer 4. Other structures are the same as those of the voltage-driven thyristor of the first embodiment shown in FIG. 1.

Modification 2

Figure 21:
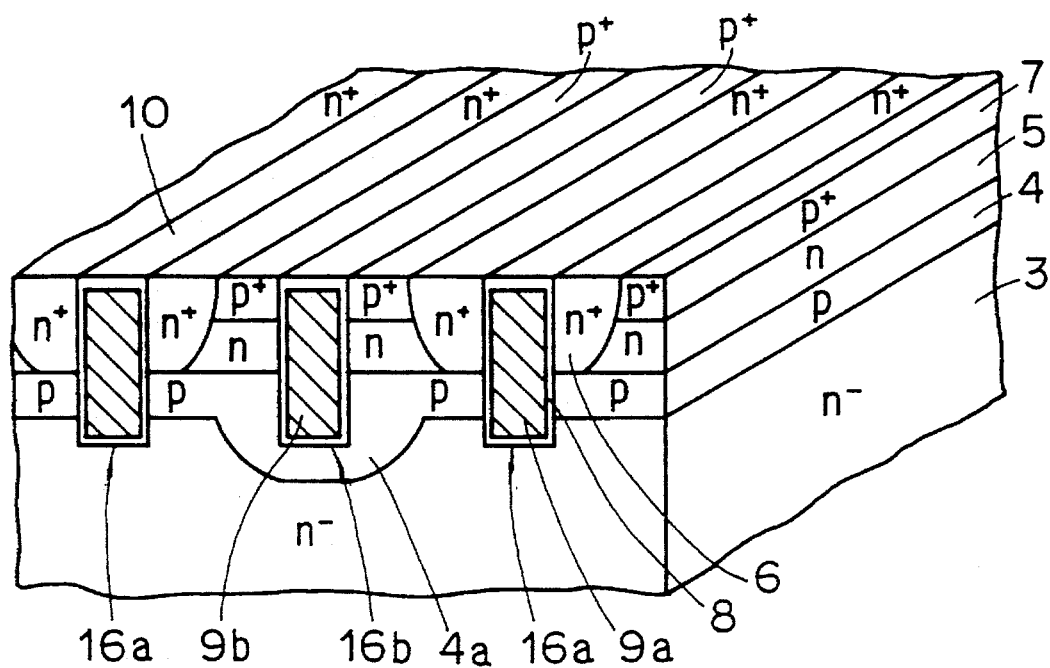

Referring to FIG. 21, a second modification of the pattern of p⁺-impurity layers 7 and n⁺-cathode layers 6 will be described below. In this modification, each n⁺-cathode layer 6 is elongated parallel to the longitudinal direction of first trench 16a. Therefore, the inverted layer of the n-channel MOS transistor is continuously formed along the side wall of first trench 16a during setting to the on-state. As a result, the on-current can flow to the cathode electrode through the channel more efficiently than the first modification.

N$^+$-cathode layer 6 has the bottom at a deep position which reaches the upper surface of p-base layer 4. Therefore, it is possible to reduce a resistance against a main current flowing through cathode layer 6 during the on-state of the voltage-driven thyristor. Accordingly, a large current can flow through the voltage-driven thyristor.

P$^+$-impurity layer 7 is continuously elongated parallel to the side wall of the second trench 16b.

Modification 3

Figure 22:
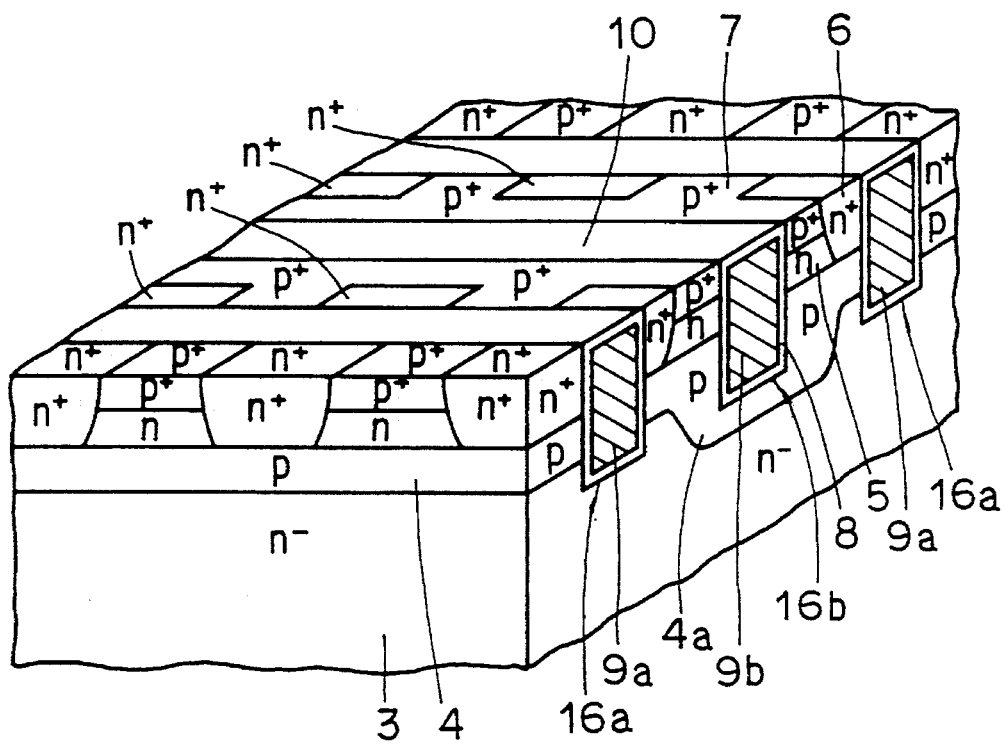

A third modification will be described below with reference to FIG. 22. FIG. 22 is a perspective view showing a voltage-driven thyristor of the third modification. Referring to FIG. 22, this modification is preferably employed in the case where, rather than turn-on characteristics, intended turn-off characteristics are to be ensured.

In this modification, as shown in FIG. 22, p$^+$-impurity layer 7 extends along the side wall of second trench 16b. P$^+$-impurity layer 7 has local portions reaching the side wall of first trench 16a. Therefore, n$^+$-cathode layers 6 are formed selectively and intermittently along the side wall of first trench 16a.

As described above, since p$^+$-impurity layer 7 extends along second trench 16b and has the local portions reaching the side wall of both first and second trenches 16a and 16b, it is possible to increase a channel width of the p-channel transistor (i.e., transistor functioning as a major component when turning off the voltage-driven thyristor) compared with the case of the second modification described before. Therefore, the voltage-driven thyristor can be set to the off-state more quickly and surely than that of the second modification.

Modification 4

Figure 23:
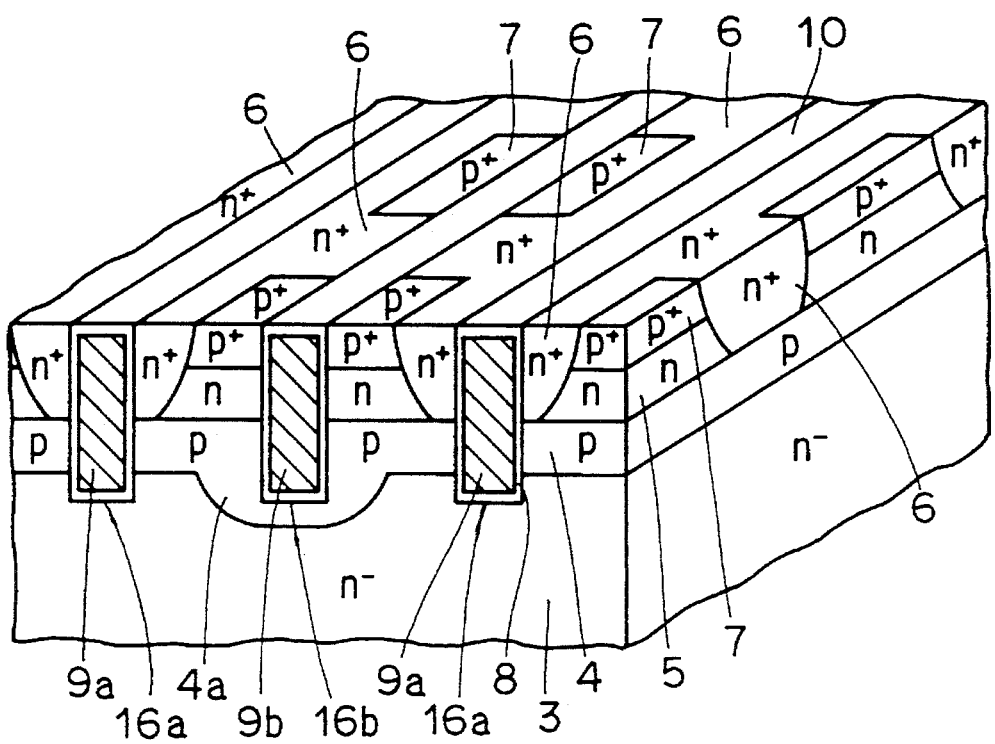
Figure 24:
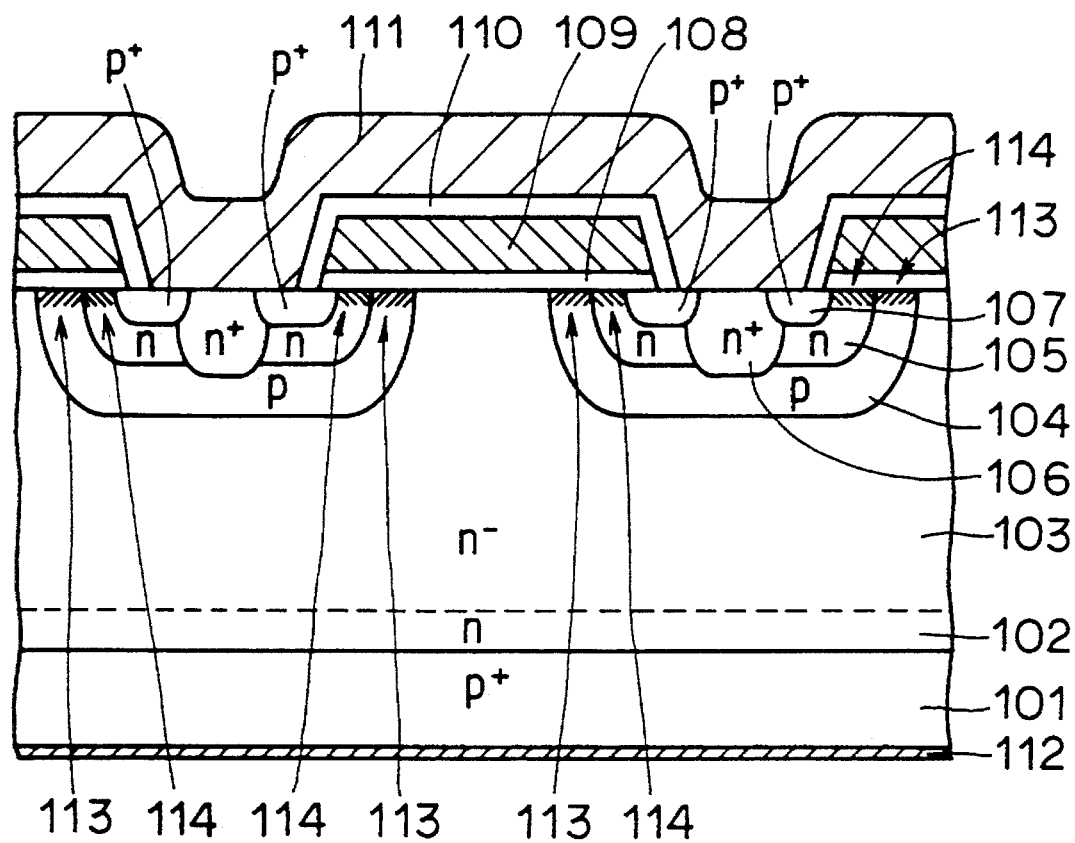
FIG. 24 is a cross section showing an example of a conventional voltage-driven thyristor.
Figure 25:
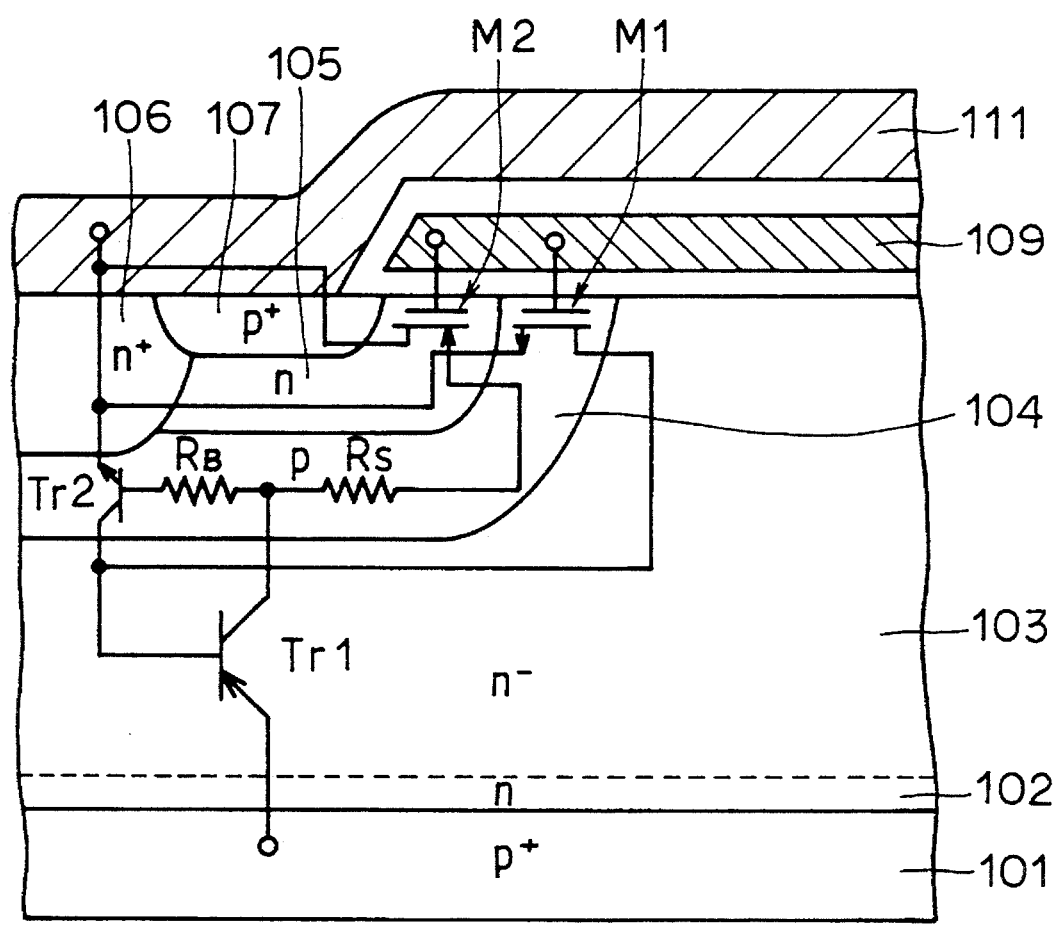
FIG. 25 shows an operation principle of the conventional voltage-driven thyristor shown in FIG. 24.
Figure 26:
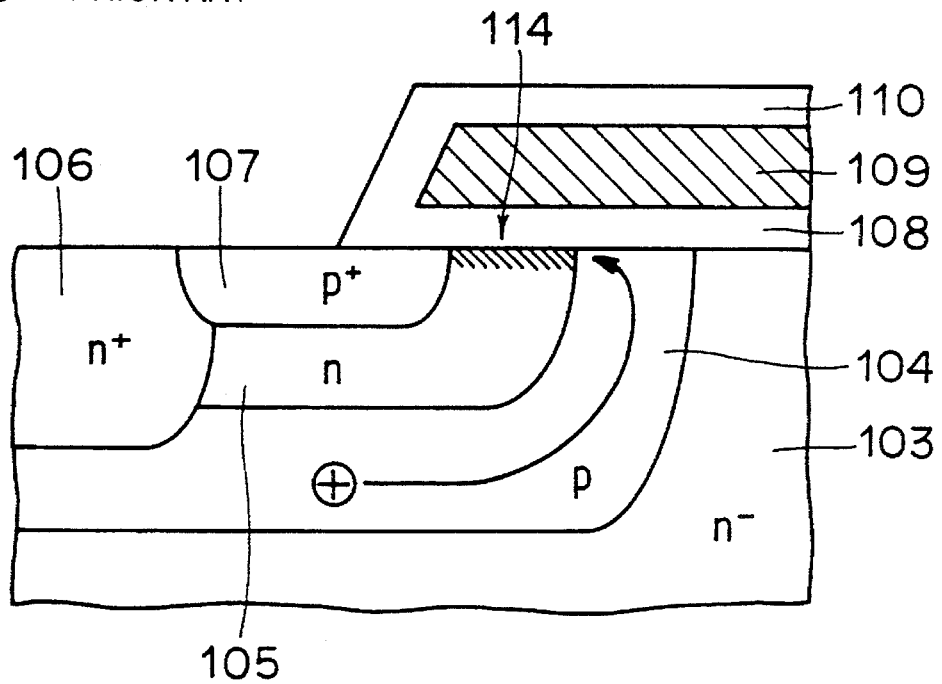
FIG. 26 is a schematic diagram for showing problems of the conventional voltage-driven thyristor shown in FIG. 24.
Figure 27:
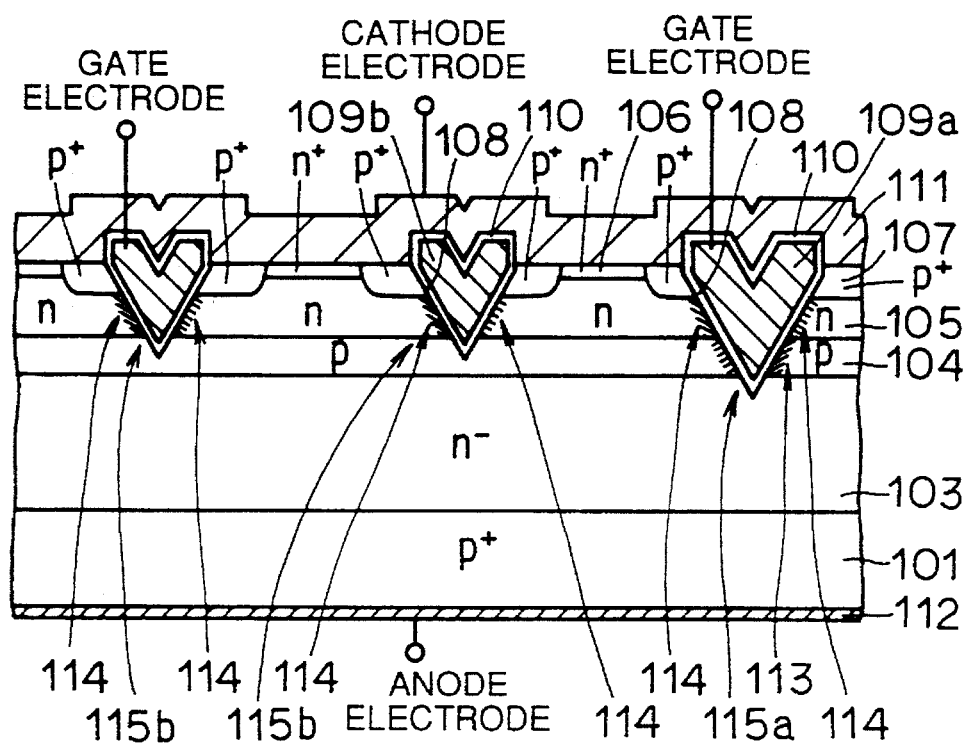
FIG. 27 is a cross section showing an example of an improved voltage-driven thyristor in the prior art.
Figure 28:
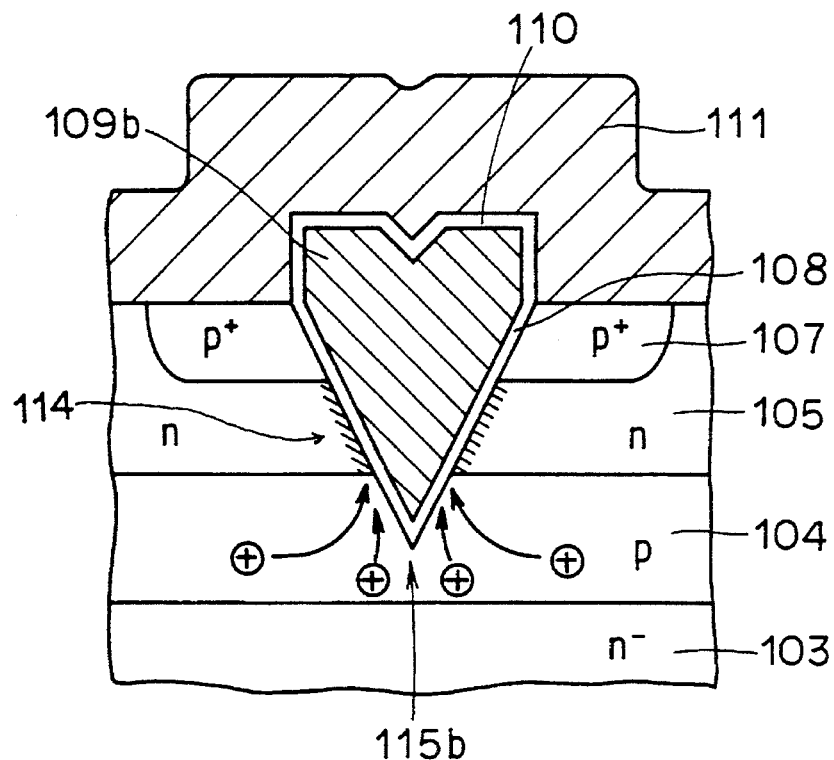
FIG. 28 shows a distinctive operation of the improved voltage-driven thyristor shown in FIG. 27.

A fourth modification will be described below with reference to FIG. 23, which is a perspective view showing a voltage-driven thyristor of the fourth modification. This modification is preferably employed in the case where, rather than turn-off characteristics, intended turn-on characteristics are to be ensured. In this modification, as shown in FIG. 23, n$^+$-cathode layer 6 is continuously formed along each side wall of first trench 16a, and has local portions reaching the side wall of second trench 16b. Thereby, it is possible to increase a contact area between the cathode electrode and n$^+$-cathode layer 6. Therefore, it is possible to reduce a resistance against the main current flowing through cathode layer 6 during the on-state of the voltage-driven thyristor. This enables the structure in which a large current can be easily obtained. P$^+$-impurity layers 7 are formed selectively and intermittently along each side wall of second trench 16b.

The first to fourth modifications described above can be applied to the second embodiment.

According to the invention, as described hereinbefore, the third semiconductor layer is provided with the second region, so that concentration of the electric field at the bottom edge of the first trench can be prevented effectively. Therefore, the voltage-driven thyristor can have high reliability.

The concentration of impurities of the first conductivity type contained in the second region of the third semiconductor layer is larger than the concentration of impurities of the first conductivity type contained in the first region of the third semiconductor layer, whereby carriers can be supplied efficiently to the MOS transistor which operates when setting the voltage-driven thyristor to the off-state. Therefore, it is possible to reduce the time required for setting the voltage-driven thyristor to the off-state and to turn the voltage-driven thyristor off even a large current. Thus, the voltage-driven thyristor can have superior turn-off characteristics.

Owing to the alternate arrangement of the first and second trenches, it is possible to increase the degree of integration of MOS transistors which operate when setting the voltage-driven thyristor to the on-state, compared with the conventional improvement. Therefore carriers can be supplied uniformly and efficiently from the first semiconductor layer into the second semiconductor layer, compared with the conventional improvement. Accordingly, it is possible to reduce a time required for setting the voltage-driven thyristor to the on-state. Thus, the voltage-driven thyristor can have superior turn-on characteristics.

Owing to arrangement of the second regions at the opposite sides of the first trench, the bottom edge of the first trench can be covered with the depletion layer spreading at the junction between the third and second semiconductor layers when the voltage-driven thyristor is in the off-state. Therefore, the voltage-driven thyristor can have improved reliability.

The impurity concentration of the first region in the third semiconductor layer adjoining to the side wall of the first trench is lower than the impurity concentration of the second region in the third semiconductor layer adjoining to the side wall of the second trench, so that carries can be supplied efficiently to the channel region of the MOS transistor which operates as a major component when the voltage-driven thyristor is set to the off-state. Therefore, it is possible to reduce the time required for setting the voltage-driven thyristor to the off-state. Thus, the voltage-driven thyristor can have superior turn-off characteristics.

The impurity layer of the first conductivity type and the third semiconductor layer are formed at different steps, so that it is possible to increase an impurity concentration of the impurity layer regardless of the impurity concentration of the third semiconductor layer. Thereby, the region, which is formed in the impurity layer and adjoins to the side wall of the first trench, has a high impurity concentration. Therefore, the voltage-driven thyristor has superior turn-off characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage-driven thyristor comprising:

a first semiconductor layer of a first conductivity type;

a second semiconductor layer of a second conductivity type formed on said first semiconductor layer;

a third semiconductor layer of the first conductivity type formed on said second semiconductor layer;

a fourth semiconductor layer of the second conductivity type formed on said third semiconductor layer;

a fifth semiconductor layer of the first conductivity type selectively formed in the surface of said fourth semiconductor layer;

a plurality of first trenches formed through said fourth and third semiconductor layers and reach said second semiconductor layer;

a plurality of second trenches formed through said fifth and fourth semiconductor layers and have bottom surfaces located in said third semiconductor layer wherein;

said first and second trenches being disposed alternately;

said voltage-driven thyristor further comprising;

first and second gate electrodes formed in said first and second trenches;

a cathode electrode formed on said fourth and fifth semiconductor layers; and an anode electrode formed on a lower surface of said first semiconductor layer.

2. The voltage-driven thyristor according to claim 1, wherein a junction portion between said third and second semiconductor layers is constant in depth from an upper surface of said fifth semiconductor layer.

3. The voltage-driven thyristor according to claim 1, wherein said third semiconductor layer has a first region and a second region, said first region having a first junction portion joining to said second semiconductor layer and located at a first depth from an upper surface of said fifth semiconductor layer, and said second region having a second junction portion joining to said second semiconductor layer and located at a second depth from said upper surface of said fifth semiconductor layer, which is larger than said first depth; and said first trenches are located through said first region, and said trenches have bottom surfaces located in said second region.

4. The voltage-driven thyristor according to claim 1, wherein said fifth semiconductor layer is selectively formed along a longitudinal direction of said first and second trenches, said fourth semiconductor layer exists between said fifth semiconductor layers, and a concentration of impurities of the second conductivity type contained in said fourth semiconductor layer existing between said fifth semiconductor layers is higher than that of said fourth semiconductor layer existing under said fifth semiconductor layer.

5. The voltage-driven thyristor according to claim 1, wherein said fifth semiconductor layer extends parallel to said second trench and along a side wall of said second trench, a surface layer of said fourth semiconductor layer extends parallel to said first trench and along a side wall of said first trench.

6. The voltage-driven thyristor according to claim 1, wherein said fifth semiconductor layer extends parallel to said second trench and along a side wall of said second trench, and said fifth semiconductor layer has a local portion reaching a side wall of said first trench.

7. The voltage-driven thyristor according to claim 1, wherein a surface layer of said fourth semiconductor layer extends parallel to said first trench and along a side wall of said first trench, said fourth semiconductor layer is provided at its surface layer with a local portion reaching a side wall of said second trench.

8. The voltage-driven thyristor according to claim 1, wherein a concentration of impurities of a first conductivity type contained in a first region of said third semiconductor layer adjoining to a side wall of said first trench is lower than that of a second region of said third semiconductor layer adjoining to a side wall of said second trench.

9. The voltage-driven thyristor according to claim 8, wherein said third semiconductor layer has a third region of the first conductivity type which has a portion located under said second trench and protrudes into said second semiconductor layer.

10. The voltage-driven thyristor according to claim 9, wherein a concentration of impurities of said first conductivity type contained in said second region is higher than that of impurities of the first conductivity type contained in said third region.

11. The voltage-driven thyristor according to claim 10, wherein a junction portion between said third region and said second semiconductor layer is located at a position deeper than that of a bottom surface of said first trench.

12. A voltage-driven thyristor comprising:

a first semiconductor layer of a first conductivity type;

a second semiconductor layer of a second conductivity type formed on said first semiconductor layer;

a third semiconductor layer of the first conductivity type formed on said second semiconductor layer;

a fourth semiconductor layer of the second conductivity type formed on said third semiconductor layer; and a fifth semiconductor layer of the first conductivity type selectively formed in a surface of said fourth semiconductor layer; wherein said third semiconductor layer including a first region, which has a first junction portion with said second semiconductor layer and located at a first depth from an upper surface of said fifth semiconductor layer, and a second region, which has a second junction portion with said second semiconductor layer and located at a second depth larger than said first depth from said upper surface of said fifth semiconductor layer;

said voltage-driven thyristor further comprising;

a first trench formed through said fourth semiconductor layer and said first region, and reaching said second semiconductor layer;

a second trench formed through said fourth and fifth semiconductor layers and having a bottom surface located in said second region;

first and second gate electrodes formed in said first and second trenches; respectively;

a cathode electrode formed on said fourth and fifth semiconductor layers; and an anode electrode is formed on a lower surface of said first semiconductor layer.

13. The voltage-driven thyristor according to claim 12, wherein a concentration of impurities of the first conductivity type contained in said second region is higher than that of impurities of the first conductivity type contained in said first region.

14. A voltage-driven thyristor comprising:

a first semiconductor layer of a first conductivity type;

a second semiconductor layer of a second conductivity type formed on said first semiconductor layer;

a third semiconductor layer of the first conductivity type formed on said second semiconductor layer;

a fourth semiconductor layer of the second conductivity type formed on said third semiconductor layer; and a fifth semiconductor layer of the first conductivity type selectively formed in a surface of said fourth semiconductor layer; wherein said third semiconductor layer including a first region, which has a first junction portion with said second semiconductor layer and located at a first depth from an upper surface of said fifth semiconductor layer, and a second region, which has a second junction portion with said second semiconductor layer and located at a second depth larger than said first depth from said upper surface of said fifth semiconductor layer;

said voltage-driven thyristor further comprising;

a first trench formed through said fourth semiconductor layer and said first region, and reaching said second semiconductor layer;

a second trench formed through said fourth and fifth semiconductor layers and having a bottom surface located in said second region;

first and second gate electrodes formed in said first and second trenches; respectively;

a cathode electrode formed on said fourth and fifth semiconductor layers; and an anode electrode is formed on a lower surface of said first semiconductor layer, wherein said second junction portion is located at a position deeper than said first trench.

15. A voltage-driven thyristor comprising:

a first semiconductor layer of a first conductivity type;

a second semiconductor layer of a second conductivity type formed on said first semiconductor layer;

a third semiconductor layer of the first conductivity type formed on said second semiconductor layer;

a fourth semiconductor layer of the second conductivity type formed on said third semiconductor layer; and a fifth semiconductor layer of the first conductivity type selectively formed in a surface of said fourth semiconductor layer; wherein said third semiconductor layer including a first region, which has a first junction portion with said second semiconductor layer and located at a first depth from an upper surface of said fifth semiconductor layer, and a second region, which has a second junction portion with said second semiconductor layer and located at a second depth larger than said first depth from said upper surface of said fifth semiconductor layer;

said voltage-driven thyristor further comprising;

a first trench formed through said fourth semiconductor layer and said first region, and reaching said second semiconductor layer;

a second trench formed through said fourth and fifth semiconductor layers and having a bottom surface located in said second region;

first and second gate electrodes formed in said first and second trenches; respectively;

a cathode electrode formed on said fourth and fifth semiconductor layers; and an anode electrode is formed on a lower surface of said first semiconductor layer, wherein a pair of said second regions are formed at opposite sides of said first region, said first trench is formed through said first region, and a pair of said second trenches have bottom surfaces located in a pair of said second regions.

16. The voltage-driven thyristor according to claim 15, wherein a plurality of first trenches are formed between a pair of second regions.

17. A voltage-driven thyristor comprising:

an anode layer of a first conductivity type;

a first base layer of a second conductivity type formed on said anode layer;

a second base layer of the first conductivity type formed on said first base layer;

a cathode layer of the second conductivity type formed on said second base layer;

an impurity layer of the first conductivity type selectively formed in the surface of said cathode layer;

a plurality of first trenches formed through said cathode layer and said second base layer and reaching said first base layer;

a plurality of second trenches, which are disposed alternately to said first trenches and are formed through said impurity layer and said cathode layer with their bottom surfaces located in said second base layer;

a plurality of on-gates formed in said first trenches;

a plurality of off-gates formed in said second trenches;

a cathode electrode formed on said cathode layer and a surface of said impurity layer; and an anode electrode formed on a lower surface of said anode layer.

* * * * *